United States Patent [19]

Gelatt, Jr. et al.

[11] Patent Number: 4,495,559
[45] Date of Patent: Jan. 22, 1985

[54] OPTIMIZATION OF AN ORGANIZATION OF MANY DISCRETE ELEMENTS

[75] Inventors: Charles D. Gelatt, Jr., Chappaqua; Edward S. Kirkpatrick, Croton-on-Hudson, both of N.Y.

[73] Assignee: International Business Machines Corporation, Armonk, N.Y.

[21] Appl. No.: 317,651

[22] Filed: Nov. 2, 1981

[51] Int. Cl.$^3$ ............................................. G06F 15/46
[52] U.S. Cl. ................................... 364/148; 364/194; 364/491; 364/300
[58] Field of Search ............... 364/148, 130, 194, 488, 364/489, 490, 491, 300

[56] References Cited

U.S. PATENT DOCUMENTS

| T935,003 | 6/1975 | Linville et al. | 444/1 |
|---|---|---|---|
| 3,617,714 | 11/1971 | Kernighan et al. | 235/150 |
| 3,621,208 | 11/1971 | Isett et al. | 235/150 |
| 3,622,762 | 11/1971 | Dyer et al. | 364/489 |
| 3,629,843 | 12/1971 | Scheinman | 340/172.5 |
| 3,653,071 | 3/1972 | Hill et al. | 364/491 X |
| 3,653,072 | 3/1972 | Ballas et al. | 364/491 X |
| 3,654,615 | 4/1972 | Freitag | 340/172.5 |
| 3,681,782 | 8/1972 | Scanlon | 444/1 |
| 3,702,003 | 10/1972 | Ramirez, Jr. et al. | 364/489 X |
| 3,702,004 | 10/1972 | Eskew et al. | 444/1 |

OTHER PUBLICATIONS

The Journal of Chemical Physics, vol. 21, No. 6, Jun. 1953, pp. 1087–1092
Physical Review B, vol. 17, No. 11, Jun. 1978, pp. 4384–4403.
A Monte–Carlo Optimizer by N. Gimbrone, 1981, Array Proceedings, Apr. 26–28, 1981.

*Primary Examiner*—Joseph F. Ruggiero
*Attorney, Agent, or Firm*—Alvin J. Riddles

[57] ABSTRACT

The overall arrangement of a large number of discrete objects may be optimized with relation to the function of or the space occupied by the arrangement by establishing a suitability measure, or score, for each configuration of the arrangement, in relation to the function of or volume occupied, generating random local changes in the arrangement, scoring the effect of the individual changes and subjecting all objects in the arrangement to a random series of incremental changes whose outcome is on average predictable. The procedure lends itself to computer simulation. It may be applied to sequencing and scheduling problems, bin packing types of problems and in complex design problems such as semiconductor chip placement, wiring network routing and logic partitioning.

6 Claims, 57 Drawing Figures

HORIZONTAL

BOUNDRY

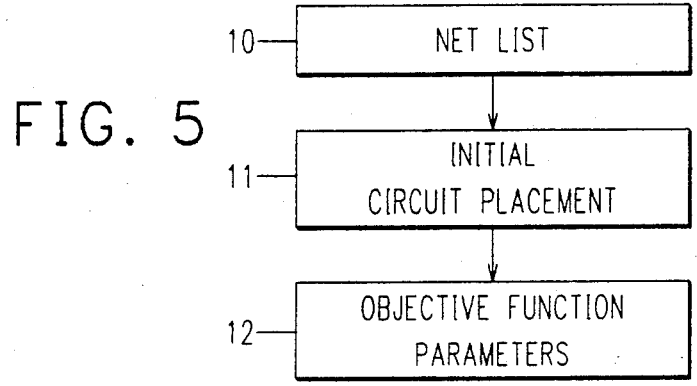
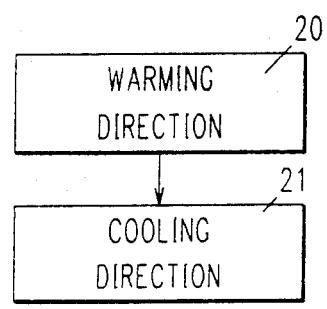
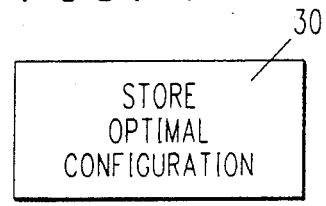

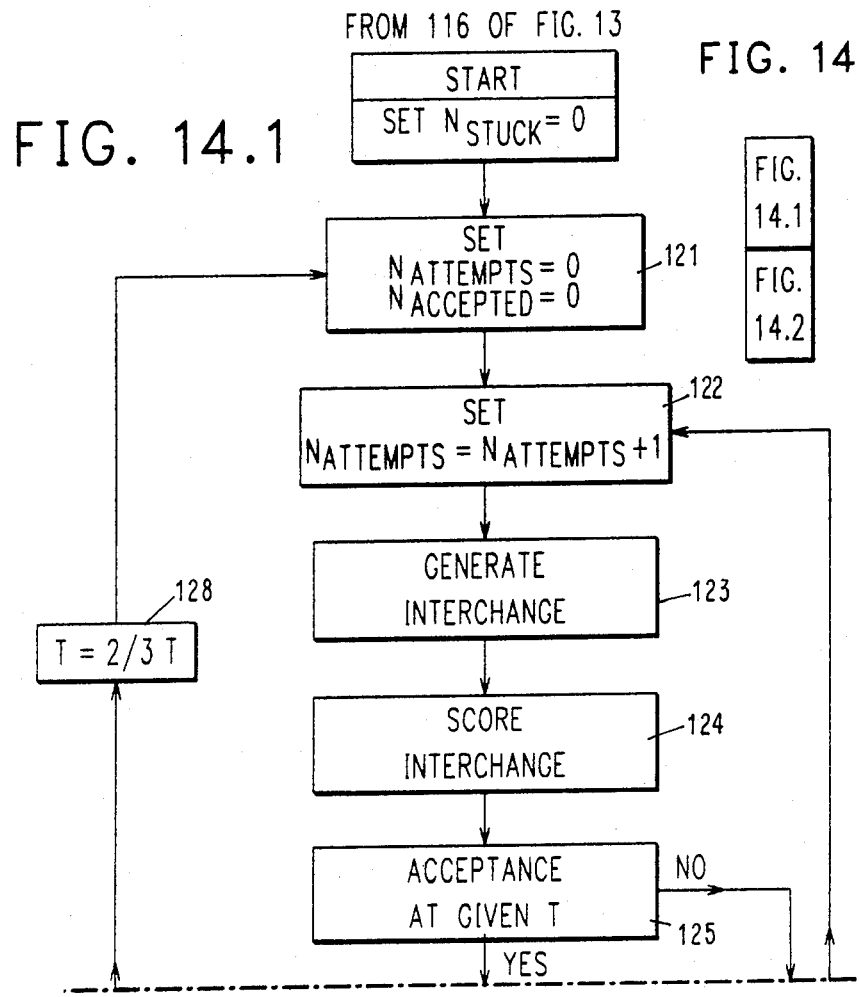

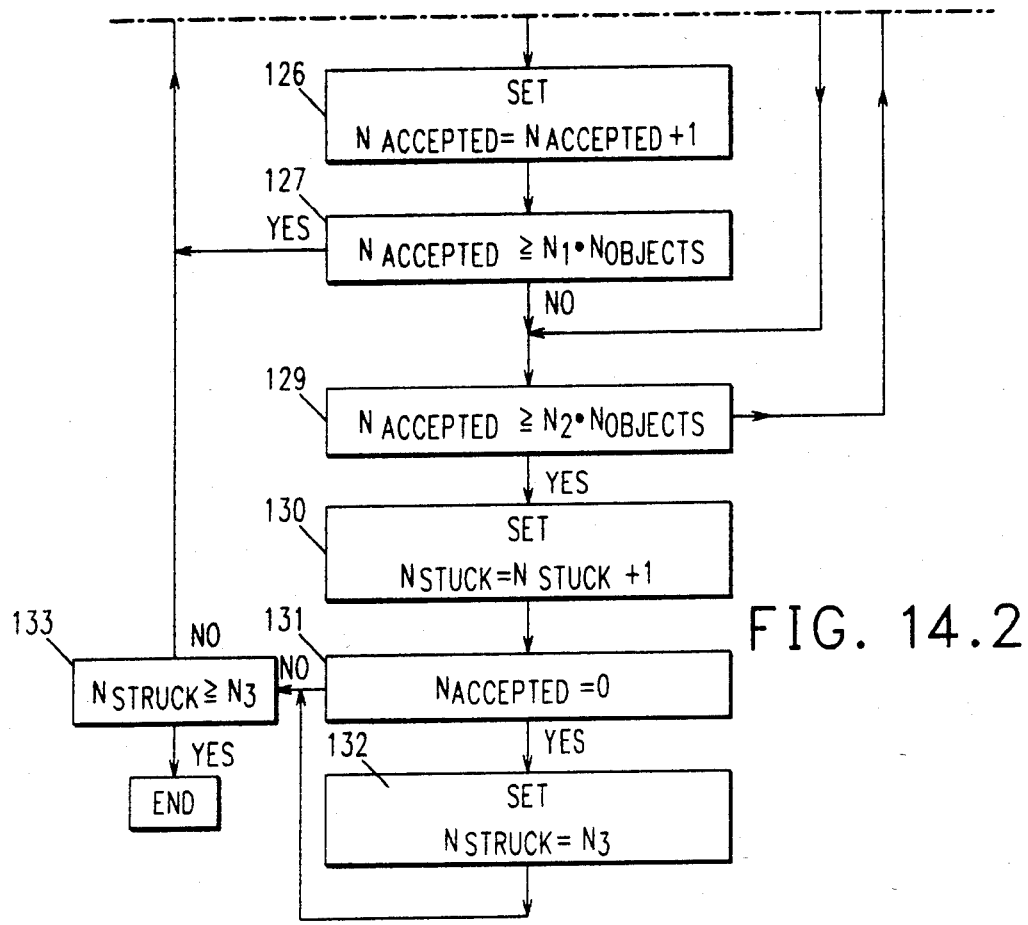
FIG. 14.2

FIG. 18

```fortran
      COMMON /NETCM1/ NCLIST(10000),NNLIST(10000)
      COMMON /NETCM2/ NNETS,NCHIPS,NCPTR(5001),NNPTR(5001),
     1   NROWS,NCOLS
      INTEGER NCLIST,NNLIST,NNETS,NCHIPS,NCPTR,NNPTR,NROWS,NCOLS
C THESE MEAN:
C NNETS - NO OF NETS
C NCHIPS - NO OF CHIPS OR CIRCUITS
C NCLIST - LIST OF CHIPS ON EACH NET, BY NETS, DENSELY STORED
C NCPTR - LIST OF POSITIONS OF FIRST ELEMENT ON EACH NET IN NCLIST
C      NCPTR(NNETS+1) = (POSITION OF LAST ELEMENT IN NCPTR) + 1
C NNLIST - LIST OF NETS ATTACHED TO EACH CHIP, BY CHIPS, DENSELY STORED
C NNPTR - POINTERS INTO NNLIST, SAME STYLE
C
C LOCAL VARIBLES
      INTEGER HISTX(10),HISTY(10),IPARAM(10)
      INTEGER IPOS(2,100),CHPNAM(100)
C IPOS - LIST OF PLACEMENT NUMBERS (X,THEN Y), BY CHIP NO
      INTEGER NETLIM(4,5000),I,IC,ISEED
      INTEGER CHPMX
      REAL TMAX
C INITIALIZATION
C    NCPTMX: MAX. NUMBER OF NETS
C    NCLMAX: MAX. NUMBER OF PINS IN NETLIST
C    CHPMAX: MAX. NUMBER OF CHIPS OR CIRCUITS
      DATA NCPTMX,NCLMAX,CHPMX/5000,10000,5000/
C
C READ IN NET LIST AND SORT ITS ENTRIES
      IUNIT = 1
      CALL MLLRD (IUNIT,NCPTR,NCLIST,NNETS,NCPTMX,NCLMAX)
C
C PRODUCE PROPERLY SORTED REVERSE NNLIST
      CALL NNLGEN (NNETS,NCLIST,NCPTR,CHPMX,NCHIPS,NNLIST,NNPTR,NCLMAX)
C
C READ IN INITIAL POSITION
C
      IUNIT = 2
      CALL RCREAD(IUNIT,IPOS,NCHIPS,CHPMX)
C NOTE: RCREAD RESETS THE VALUE OF NCHIPS TO THE HIGHEST NUMBER IN
C    THE ROWSCOLS FILE
      NROWS = 0
      NCOLS = 0
      DO 20 IC=1,NCHIPS
      IF(IPOS(1,IC).GT.NCOLS) NCOLS = IPOS(1,IC)
      IF(IPOS(2,IC).GT.NROWS) NROWS = IPOS(2,IC)
 20   CONTINUE
      WRITE(6,22) NROWS,NCOLS
 22   FORMAT(' MAIN: NROWS,NCOLS =',2I5)
C
C READ IN THE CHIP NAMES
      DO 30 I=1,NCHIPS
 30   READ(4,40) CHPNAM(I)
```

FIG. 19

```
  40    FORMAT(A3)
C
C DETERMINE INITIAL SITUATION -- NETLIMITS AND HISTOGRAMS OF NECESSARY
C X AND Y NET BOUNDARY CROSSINGS
C
       CALL NHIST (IPOS,HISTX,HISTY,NETLIM)
       WRITE(6,50)
  50   FORMAT(/' INITIAL POSITION:'/)
       CALL POSDSP(NCHIPS,IPOS,CHPNAM,HISTX,HISTY,NROWS,NCOLS)
C
       WRITE(6,60)
  60   FORMAT(' ENTER ISEED:')
       READ(5,*) ISEED
       WRITE(6,65) ISEED
  65   FORMAT(' MAIN: ISEED=',I8)
C
C READ IN SCORING PARAMETERS
C
       CALL SCOREI (IPARAM)
C
C GO THROUGH THE WARMING AND COOLING PHASES OF THE ANNEALING SCHEDULE
C
       CALL WARM(ISEED,IPARAM,NETLIM,IPOS,HISTX,HISTY,TMAX)
       CALL COOL(ISEED,IPARAM,NETLIM,IPOS,HISTX,HISTY,CHPNAM,TMAX)
C
C WRITE OUT FINAL CONFIGURATION
       WRITE(6,70)
  70   FORMAT(/' FINAL POSITION:'/)
       CALL POSDSP(NCHIPS,IPOS,CHPNAM,HISTX,HISTY,NROWS,NCOLS)
C
       STOP
       END
```

FIG. 20

```
      SUBROUTINE MLLRD(IUNIT,NETPTR,NETS,NNETS,NNETMX,NETSMX)
C
C ROUTINE TO READ IN AN MLL FORMAT NETLIST
C
      INTEGER*4 IUNIT,NETPTR(NNETMX),NETS(NETSMX),NNETS,NNETMX,NETSMX
C LOCAL VARIABLES
      INTEGER*4 CARD(20),CDS,FORM,INNET,INPUT(18)
      DATA CDS/'CDS'/,FORM/'FORM'/
C
C SEARCH FOR "CDS FORMAT" HEADER CARD
 10   READ(IUNIT,20,END=1000) CARD
 20   FORMAT(20A4)
      IF(CARD(1).NE.CDS) GOTO 10
      IF(CARD(2).NE.FORM) GOTO 10
C
C READ IN NET LIST
      NETP = 0
      NET = 0
 100  READ(IUNIT,110) INNET,INPUT
 110  FORMAT(19I4)
C A ZERO NET NUMBER INDICATES A CONTINUATION CARD
      IF(INNET.EQ.0) GOTO 120
C CHECK THAT NETS ARE CONSECUTIVE
      NET = NET + 1
      IF(NET.GT.NNETMX) GOTO 1100
      NETPTR(NET) = NETP+1
C  AN EMPTY NET-LIST INDICATES END OF NET-LIST
      IF(INPUT(1).EQ.0) GOTO 200
C
 120  DO 130 I = 1,17,2
      IF(INPUT(I).EQ.0) GOTO 140
C ELIMINATE REDUNDANT CHIPS FROM LIST
      N1 = NETPTR(NET)
      N2 = NETP
      IF( N2 .LT. N1 ) GOTO 128
      DO 125 NP=N1,N2
      IF(INPUT(I).EQ.NETS(NP)) GOTO 130
 125  CONTINUE
 128  NETP = NETP+1
      IF(NETP.GT.NETSMX) GOTO 1300
      NETS(NETP) = INPUT(I)
 130  CONTINUE
      GOTO 100
C
C CHECK THAT AFTER REMOVING REDUNDANT CHIPS THE NET STILL HAS AT LEAST
C     TWO PINS. IF NOT, ELIMINATE THE NET FROM THE LISTS
 140  IF(NETP-1 .GE. NETPTR(NET)) GOTO 100
      NETP = NETP-1
      NET = NET - 1
      GOTO 100
C
```

FIG. 21

```
  200  NNETS = NET-1
C
C SORT THE ELEMENTS OF CHIP-LIST FOR EACH NET INTO ASCENDING ORDER
       DO 300 I = 1,NNETS
       I1 = NETPTR(I)
       I2 = NETPTR(I+1) - 1
       J = I2 - I1 + 1
       IF (J.GE.2) GOTO 280
       WRITE (6,270)   I
  270  FORMAT (' MLLRD:  BAD DATA AT NET NO I=',I6)
       STOP 12
  280  CALL ISORT(NETS(I1),J)
  300  CONTINUE
       RETURN
C .
C END OF FILE REACHED
 1000 WRITE(6,1010) IUNIT
 1010 FORMAT(' MLLRD: END OF FILE REACHED ON UNIT',I3,' WHILE SEARCHING'
      1    ,' FOR PREFIX CARD.')
       STOP 16
C
C NET POINTER OVERFLOW
 1100 WRITE(6,1110) INNET
 1110 FORMAT(' MLLRD: TOO MANY NETS IN LIST WHILE READING NET',I6)
       STOP 16
C
C TOO MANY TOTAL PINS FOR NET ARRAY
 1300 WRITE(6,1310) INNET,NETSMX
 1310 FORMAT(' MLLRD: WHILE PROCESSING NET',I6,' EXCEEDED LIMIT OF',I6,
      1    ' PINS')
       STOP 16
       END
```

FIG. 22

```
      SUBROUTINE ISORT(A,N)
C
C INTEGER ARRAY SORTING ROUTINE. SORTS N ELEMENTS INTO ASCENDING ORDER
C   IN PLACE, THAT IS, THE ORIGINAL ARRAY IS OVERWRITTEN
C
      INTEGER A(1),N,ATEMP,I,J,K,L,M
C
      M=N
C
   10 M=M/2
      IF(M.EQ.0) GO TO 50
C
      K=N-M
      J=1
   20 I=J
   30 L=I+M
      IF( A(I) .LE. A(L) ) GO TO 40
C
      ATEMP = A(I)
      A(I) = A(L)
      A(L) = ATEMP
      I=I-M
      IF(I.GT.0) GO TO 30
C
   40 J=J+1
      IF(J.LE.K) GO TO 20
      GO TO 10
C
   50 RETURN
      END
```

FIG. 23

```
      SUBROUTINE NNLGEN(NNETS,NCLIST,NCPTR,CHIPMX,NCHIPS,NNLIST,NNPTR,
     1    NNLMAX)
C
C THIS ROUTINE CREATES A PACKED LIST OF THE NETS CONNECTED TO A CHIP
C
      INTEGER NNETS,NCLIST(1),NCPTR(NNETS),CHIPMX,NCHIPS
      INTEGER NNLIST(1),NNPTR(1),NNLMAX
C LOCAL STORAGE
      INTEGER TEMP,CHPMAX,CHIP
      INTEGER*2 FREE,END,IPTR,PTRMAX,INET
      INTEGER*2 NNDATA(10000),PTR(10000),CHPPTR(5001)
      DATA END/-1/,PTRMAX/10000/,CHPMAX/5001/
C
      DO 10 I=1,CHPMAX
 10   CHPPTR(I) = END
C
C CREATE THE TEMPORARY LIST OF NETS ATTACHED TO A CHIP
C    THE NETS ARE CONTAINED IN NNDATA, PTR CONTAINS A POINTER TO THE
C    NEXT ENTRY, CHPPTR(CHIP) IS THE POINTER TO THE FIRST ENTRY FOR
C    THE GIVEN CHIP
      NCHIPS = 0
      FREE = 1
      DO 100 INET = 1,NNETS
         IC1 = NCPTR(INET)
         IC2 = NCPTR(INET+1) - 1
         IF( IC2 .LT. IC1 ) GOTO 1000
         DO 100 IC=IC1,IC2
            CHIP = NCLIST(IC)
            IF(CHIP.GT.CHPMAX) STOP 15
            NCHIPS = MAX0(NCHIPS,CHIP)
            IF( NCHIPS .GT. CHIPMX ) GOTO 1050
            IPTR = CHPPTR(CHIP)
            PTR(FREE) = IPTR
            NNDATA(FREE) = INET
            CHPPTR(CHIP) = FREE
            FREE = FREE + 1
            IF( FREE .GT. PTRMAX ) GOTO 1100
 100  CONTINUE
C
C PACK CHIP NET-LIST INTO NNLIST, THEN INVERT ORDER TO OBTAIN A
C   SMALLEST-FIRST SORT
C
      IF( CHIPMX.GT.CHPMAX ) GOTO 1200
      I = 1
      DO 200 IC=1,CHIPMX
         NNPTR(IC) = I
         IPTR = CHPPTR(IC)
C PACK INVERSE ORDERED LIST INTO NNLIST
 170     IF(IPTR .EQ. END ) GOTO 180
            IF(I.GT.NNLMAX) GOTO 1300
            NNLIST(I) = NNDATA(IPTR)
            I = I + 1
```

FIG. 24

```
            IPTR = PTR(IPTR)
            GOTO 170
C INVERT INTO ASCENDING ORDER
  180     I1 = NNPTR(IC) - 1
          I2 = I
          N = ( I2 - I1 - 1 )/2
          IF( N .EQ. 0 ) GOTO 200
          DO 190 J=1,N
            TEMP = NNLIST( I1 + J )
            NNLIST( I1 + J ) = NNLIST( I2 - J )
  190       NNLIST( I2 - J ) = TEMP
  200     CONTINUE
          NNPTR(CHIPMX+1) = I
          RETURN
C
 1000 WRITE(6,1010) INET
 1010 FORMAT(' NNLGEN: NET',I6,' CONTAINS < 2 NODES')
      STOP 12
C
 1050 WRITE(6,1060) NCHIPS,CHIPMX
 1060 FORMAT(' NNLGEN: NCHIPS =',I6,' GREATER THAN CHIPMX =',I6)
      STOP 12
C
 1100 WRITE(6,1110) PTRMAX
 1110 FORMAT(' NNLGEN: NEED MORE THAN',I6,' ENTRIES FOR LOCAL',
     1      ' STORAGE IN CONSTRUCTING NNLIST')
      STOP 12
C
 1200 WRITE(6,1210) CHIPMX,CHPMAX
 1210 FORMAT(' NNLGEN: DATA CALLS FOR',I6,' CHIPS BUT LOCAL STORAGE',
     1      ' ALLOWS ONLY',I6)
      STOP 12
C
 1300 WRITE(6,1310) NNLMAX
 1310 FORMAT(' NNLGEN: MORE THAN',I6,' ELEMENTS OF NNLIST REQUIRED.')
      STOP 12
      END
```

FIG. 25

```
      SUBROUTINE RCREAD(IUNIT,ROWCOL,MXCIRC,RCMAX)
C
C ROUTINE TO READ ROW-COLUMN DATA FILE
C
      INTEGER*4 IUNIT,ROWCOL(2,1),MXCIRC,RCMAX
C LOCAL VARIABLES
      INTEGER*4 RC(2)
      INTEGER*4 PREFIX(3),CARD(3),IC
      DATA PREFIX/'..RO','WS/C','OLS'/
C
C SEARCH FOR PREFIX CARD
      REWIND IUNIT
 10   READ(IUNIT,20,END=1000) CARD
 20   FORMAT(3A4)
      IF(CARD(1).NE.PREFIX(1)) GOTO 10
      IF(CARD(2).NE.PREFIX(2)) GOTO 10
      IF(CARD(3).NE.PREFIX(3)) GOTO 10
C
      DO 90 IC=1,RCMAX
      ROWCOL(1,IC)=0
 90   ROWCOL(2,IC)=0
      MXCIRC=-1
C
C READ IN ROW-COLUMN DATA
 100  READ(IUNIT,110) IC,RC
 110  FORMAT(3I4)
C A CIRCUIT NUMBER EQUAL TO 9999 INDICATES END OF DATA
      IF(IC.EQ.9999) GOTO 200
      IF(IC.GT.RCMAX) GOTO 1100
      IF(IC.GT.MXCIRC) MXCIRC=IC
      DO 120 I=1,2
      J=3-I
 120  ROWCOL(I,IC)=RC(J)
      GOTO 100
C
 200  RETURN
C
C END OF FILE REACHED
 1000 WRITE(6,1010)
 1010 FORMAT(' RCREAD: REACHED END OF FILE WHILE SEARCHING FOR',
     1       ' ROWS/COLS CARD')
      STOP 16
C
C TOO HIGH A CIRCUIT NUMBER
 1100 WRITE(6,1110) IC,RCMAX
 1110 FORMAT(' RCREAD: CIRCUIT',I6,' LARGER THAN',I6,' LIMIT.')
      STOP 16
      END
```

FIG. 26

```
      SUBROUTINE NHIST (IPOS,HISTX,HISTY,NETLIM)
C
C THIS CALCULATES THE HISTOGRAMS OF NECESSARY WIRE DENSITIES, PROJECTED
C IN THE X AND Y DIRECTIONS, FOR A GIVEN CONFIGURATION, DESCRIBED
C BY THE POSITION LIST IPOS
C
      INTEGER IPOS(2,1),HISTX(1),HISTY(1),NETLIM(4,1)
      COMMON /NETCM1/ NCLIST(10000),NNLIST(10000)
      COMMON /NETCM2/ NNETS,NCHIPS,NCPTR(5001),NNPTR(5001),
     1    NROWS,NCOLS
      INTEGER NNETS,NCHIPS,NCLIST,NCPTR,NNLIST,NNPTR
C LOCAL VARIABLES
      INTEGER XMAX,XMIN,X,YMAX,YMIN,Y
C
      DO 10 I=1,NCOLS
   10 HISTX(I) = 0
      DO 20 I=1,NROWS
   20 HISTY(I) = 0
C
      DO 100 I=1,NNETS
      J1=NCPTR(I)
      J2=NCPTR(I+1)-1
      IF (J2.LE.J1) GOTO 200
      K = NCLIST(J1)
      XMAX = IPOS(1,K)
      XMIN = XMAX
      YMAX = IPOS(2,K)
      YMIN = YMAX
      J1 = J1+1
      DO 90 J = J1,J2
      K = NCLIST(J)
      X = IPOS(1,K)
      Y = IPOS (2,K)
      XMAX = MAX0 (XMAX,X)
      XMIN = MIN0 (XMIN,X)
      YMAX = MAX0 (YMAX,Y)
   90 YMIN = MIN0 (YMIN,Y)
      NETLIM(1,I) = XMAX
      NETLIM(2,I) = XMIN
      NETLIM(3,I) = YMAX
      NETLIM(4,I) = YMIN
      HISTX(XMIN) = HISTX(XMIN) + 1
      HISTX(XMAX) = HISTX(XMAX) - 1
      HISTY(YMIN) = HISTY(YMIN) + 1
  100 HISTY(YMAX) = HISTY(YMAX) - 1
C
      IF(NCOLS.LT.2) GOTO 120
      DO 110 I=2,NCOLS
  110 HISTX(I)=HISTX(I)+HISTX(I-1)
C
  120 IF(NROWS.LT.2) GOTO 140
      DO 130 I=2,NROWS
```

FIG. 27

```
130   HISTY(I)=HISTY(I)+HISTY(I-1)
140   RETURN
C
200   WRITE(6,210) I
210   FORMAT(' NHIST: FATAL ERROR. NET',I6,' CONTAINS < 2 NODES')
      STOP 12
      END
```

FIG. 28

```
      SUBROUTINE POSDSP(NCHIPS,IPOS,CHPNAM,HISTX,HISTY,NROWS,NCOLS)
C
C POSDSP PRINTS OUT THE CURRENT LOCATION OF ALL OBJECTS AND THE
C   CURRENT HISTOGRAMS
C
      INTEGER NCHIPS,IPOS(2,1),CHPNAM(1),HISTX(1),HISTY(1),NROWS,NCOLS
C LOCAL VARIABLES
      INTEGER ICHIP(10,10),NRCMAX,IC,IX,IY
      DATA NRCMAX/10/
C
      NROWS = 0
      NCOLS = 0
      DO 20 IC=1,NCHIPS
      IX=IPOS(1,IC)
      IF(IX.GT.NCOLS) NCOLS = IX
      IY=IPOS(2,IC)
      IF(IY.GT.NROWS) NROWS = IY
      IF(NROWS.LE.NRCMAX .AND. NCOLS.LE.NRCMAX) GOTO 20
      WRITE(6,10) NROWS,NCOLS
 10   FORMAT(' POSDSP: DIMENSION OF ICHIP EXCEEDED. NROWS,NCOLS =',2I6)
      STOP 8
 20   ICHIP(IX,IY) = CHPNAM(IC)
C
      WRITE(6,30)
 30   FORMAT(1X)
      DO 60 IY = 1,NROWS
      WRITE(6,40) (ICHIP(IX,IY),IX=1,NCOLS)
 40   FORMAT(6X,10A5)
      IF( IY .LT. NROWS) WRITE(6,50) HISTY(IY)
 50   FORMAT(1X,I5)
 60   CONTINUE
      NCOLM1 = NCOLS - 1
      WRITE(6,70) (HISTX(IX),IX=1,NCOLM1)
 70   FORMAT(6X,10I5)
      WRITE(6,30)
C
      RETURN
      END
```

FIG.29

```
      SUBROUTINE SCOREI (IPARAM)
C
C SCOREI READS IN PARAMETERS FOR THE OBJECTIVE FUNCTION
C
      INTEGER IPARAM(10)
      REAL TRATIO
C
      WRITE(6,10)
 10   FORMAT(' SCOREI: INPUT VALUES FOR X-PLATEAU, LAMDAX, Y-PLATEAU,
     -        ' LAMDAY:')
      READ(5,*) (IPARAM(I),I=1,4)
      WRITE(6,20)
 20   FORMAT('     X-PLAT    LAMDAX    Y-PLAT    LAMDAY')
      WRITE(6,30) (IPARAM(I),I=1,4)
 30   FORMAT(1X,4I10)
      WRITE(6,40)
 40   FORMAT(' SCOREI: INPUT COLLING PARAMETERS N1, N2, N3 AND TRATIO:')
      READ(5,*) (IPARAM(I),I=5,7),TRATIO
      IPARAM(8) = IFIX( 100.*TRATIO + 0.5 )
      TRATIO = FLOAT(IPARAM(8))/100.
      WRITE(6,50)
 50   FORMAT('    N1   N2   N3    TRATIO')
      WRITE(6,60) (IPARAM(I),I=5,7),TRATIO
 60   FORMAT(1X,3I5,F10.5)
C
      RETURN
      END
```

FIG. 30

```
      SUBROUTINE WARM(ISEED,IPARAM,NETLIM,IPOS,HISTX,HISTY,TMAX)
C
C WARM SIMULATES HEATING A SYSTEM UP TO A TEMPERATURE AT WHICH MOST
C   ATTEMPTED MOVES ARE ACCEPTED
C
      INTEGER ISEED,IPARAM(1),NETLIM(4,1),IPOS(2,1),HISTX(1),HISTY(1)
      REAL TMAX
      COMMON /NETCM1/ NCLIST(10000),NNLIST(10000)
      COMMON /NETCM2/ NNETS,NCHIPS,NCPTR(5001),NNPTR(5001),
     1    NROWS,NCOLS
      INTEGER NNETS,NCHIPS,NCLIST,NCPTR,NNLIST,NNPTR
C LOCAL VARIABLES
      INTEGER NHISTX(10),NHISTY(10),IJLIST(200),IJL,IJLIM(4,200)
      INTEGER IJLMAX
      INTEGER MOVED(2)
      REAL RAN(3),T0,T,BETA,SCORE,SCORIT,RESULT,NEWSCR,NSCORE,RATIO
      REAL SRATIO,TRATIO
      DATA IJLMAX/200/
      DATA SRATIO/0.9/, TRATIO/10./
C INITIALIZE RANDOM NUMBER GENERATOR
      CALL SPIE
C
C DETERMINE INITIAL TEMPERATURE BY MAKING A RANDOM MOVE
C
C FIND INITIAL VALUE OF THE OBJECTIVE FUNCTION
      SCORE = SCORIT(IPARAM,NROWS,NCOLS,HISTX,HISTY)
C
C GENERATE A RANDOM MOVE
  100 CALL GGL2(ISEED,RAN,2)
      CALL GENMOV(RAN,NCHIPS,IPOS,MOVED,NMOVED)
C IF NOTHING MOVED, TRY AGAIN
      IF( NMOVED.EQ.0 ) GOTO 100
C
C  SCORE THE MOVE (NEWSCR RETURNS THE NEW SCORE)
      NSCORE = NEWSCR(MOVED,NMOVED,IPOS,IPARAM,NETLIM,IJLIST,IJL,IJLIM,
     1      IJLMAX,HISTX,HISTY,NHISTX,NHISTY)
C
C INITIAL TEMPERATURE IS THE DIFFERENCE IN SCORE BETWEEN THE ORIGINAL
C   CONFIGURATION AND THIS NEW CONFIGURATION
      T0 = ABS( NSCORE - SCORE )
      SCORE = NSCORE
C
C IF NEW AND OLD SCORE ARE THE SAME, TRY ANOTHER MOVE
      IF( T0 .EQ. 0. ) GOTO 100
      WRITE(6,110) T0
  110 FORMAT(' WARM: INITIAL TEMPERATURE = ',1PG12.3)
      T = T0
      NTRIES = MAX0( NCHIPS, 10 )
C
C TRY SEVERAL MOVES TO SEE IF THIS TEMPERATURE IS HOT ENOUGH
  200 BETA = 1.0/T
```

FIG. 31

```
      IKEPT = 0
C
      DO 300 ITRY = 1,NTRIES
C
C GENERATE A MOVE
 210  CALL GGL2(ISEED,RAN,3)
      CALL GENMOV(RAN,NCHIPS,IPOS,MOVED,NMOVED)
C IF NOTHING MOVED, TRY AGAIN
      IF( NMOVED.EQ.0 ) GOTO 210
C
C  SCORE THE MOVE (NEWSCR RETURNS THE NEW SCORE)
      NSCORE = NEWSCR(MOVED,NMOVED,IPOS,IPARAM,NETLIM,IJLIST,IJL,IJLIM,
     1       IJLMAX,HISTX,HISTY,NHISTX,NHISTY)
      RESULT = NSCORE - SCORE
C
C USE ALGORITHM TO DECIDE TO ACCEPT THE MOVE OR NOT
      EXPON = BETA*RESULT
      IF( EXPON.GT.30. ) GOTO 230
      IF( EXPON.LE.0.  ) GOTO 220
      IF( EXP( -EXPON ) .LT. RAN(3) ) GOTO 230
C
C EXCHANGE IS ACCEPTABLE. UPDATE ARRAYS TO REFLECT THE MOVE
C
 220  CALL KEEPMV(NROWS,NCOLS,NHISTX,NHISTY,HISTX,HISTY,
     1       IJLIST,IJL,IJLIM,NETLIM)
      IKEPT = IKEPT + 1
      SCORE = NSCORE
      GOTO 300
C
C MOVE NOT ACCEPTABLE. TAKE IT OUT.
 230  CALL DROPMV(MOVED,NMOVED,IPOS)
C
 300  CONTINUE
C END OF NTRIES TRIALS
      RATIO = FLOAT(IKEPT) / FLOAT(NTRIES)
      WRITE(6,310) T,IKEPT,NTRIES,RATIO
 310  FORMAT(' WARM: T=',1PG12.3,',',',I5,' SUCCESSES IN',I6,' ATTEMPTS.
     -         ,' RATIO=',F6.3)
C
C IS THE SUCCESS RATIO HIGH ENOUGH TO USE THIS AS THE "HOT" TEMPERATURE?
      IF( RATIO .GE. SRATIO ) GOTO 400
C
C IF NOT, TRY A HIGHER TEMPERATURE
      T = TRATIO*T
      GOTO 200
C
C SUCCESSFULLY FOUND A HIGH ENOUGH TEMPERATURE
 400  TMAX = T
      RETURN
C
      END
```

FIG. 32

```
      SUBROUTINE COOL(ISEED,IPARAM,NETLIM,IPOS,HISTX,HISTY,CHPNAM,TMAX)
C
C COOL SIMULATES THE COOLING PHASE OF AN ANNEALING SCHEDULE STARTING
C    AT TEMPERATURE TMAX.
C
      INTEGER ISEED,IPARAM(1),NETLIM(4,1),IPOS(2,1),HISTX(1),HISTY(1)
      INTEGER CHPNAM(1)
      REAL TMAX
      COMMON /NETCM1/ NCLIST(10000),NNLIST(10000)
      COMMON /NETCM2/ NNETS,NCHIPS,NCPTR(5001),NNPTR(5001),
     1    NROWS,NCOLS
      INTEGER NNETS,NCHIPS,NCLIST,NCPTR,NNLIST,NNPTR
C
C LOCAL VARIABLES
      INTEGER NHISTX(10),NHISTY(10),IJLIST(200),IJL,IJLIM(4,200),IJLMAX
      INTEGER MOVED(2),NMOVED,IKEPT,NSTUCK,N1,N2,N3
      REAL RAN(3),T,BETA,SCORE,SCORIT,RESULT,NEWSCR,NSCORE,TRATIO
      DATA IJLMAX/200/
C
      N1 = IPARAM(5)
      N2 = IPARAM(6)
      N3 = IPARAM(7)
      TRATIO = FLOAT(IPARAM(8))/100.
      CALL SPIE
      T = TMAX
      NTRIES = N2*NCHIPS
      NSTUCK = 0
C
  100 BETA = 1./T
      IKEPT = 0
      SCORE = SCORIT(IPARAM,NROWS,NCOLS,HISTX,HISTY)
      DO 300 ITRY = 1,NTRIES
C
C GENERATE A MOVE
  210 CONTINUE
      CALL GGL2(ISEED,RAN,3)
      CALL GENMOV(RAN,NCHIPS,IPOS,MOVED,NMOVED)
C IF NOTHING MOVED, TRY AGAIN
      IF( NMOVED.EQ.0 ) GOTO 210
C
C  SCORE THE MOVE (NEWSCR RETURNS THE NEW SCORE)
      NSCORE = NEWSCR(MOVED,NMOVED,IPOS,IPARAM,NETLIM,IJLIST,IJL,IJLIM,
     1     IJLMAX,HISTX,HISTY,NHISTX,NHISTY)
      RESULT = NSCORE - SCORE
      EXPON = BETA*RESULT
      IF( EXPON.GT.30. ) GOTO 230
      IF( EXPON.LE.0. ) GOTO 220
      IF( EXP( -EXPON ) .LT. RAN(3) ) GOTO 230
C
C EXCHANGE IS ACCEPTABLE. UPDATE ARRAYS TO REFLECT THE MOVE
C
  220 CALL KEEPMV(NROWS,NCOLS,NHISTX,NHISTY,HISTX,HISTY,
```

FIG. 33

```
      1     IJLIST,IJL,IJLIM,NETLIM)
        IKEPT = IKEPT + 1
        SCORE = NSCORE
C
C HAVE WE ACCEPTED ENOUGH MOVES AT THIS TEMPERATURE?
        IF( IKEPT .GE. N1*NCHIPS ) GOTO 400
        GOTO 300
C
C MOVE NOT ACCEPTABLE. TAKE IT OUT.
 230    CALL DROPMV(MOVED,NMOVED,IPOS)
C
 300    CONTINUE
        ITRY = NTRIES
C
C FELL OUT OF LOOP -> DID NOT ACCEPT N1*NCHIPS MOVES.  WE ARE STUCK
        NSTUCK = NSTUCK + 1
C
C IF THERE WERE NO SUCCESSES, IT IS TIME TO STOP
        IF( IKEPT .EQ. 0 ) NSTUCK = N3
C
 400    WRITE(6,410) T,IKEPT,ITRY
 410    FORMAT(/' COOL: FOR T=',1PG12.3,',',I6,' SUCCESSES IN',I6,
       -        ' ATTEMPTS. CURRENT POSITION:')
        CALL POSDSP(NCHIPS,IPOS,CHPNAM,HISTX,HISTY,NROWS,NCOLS)
C REDUCE THE TEMPERATURE
        T = TRATIO*T
C
C HAVE WE BEEN STUCK LONG ENOUGH TO STOP?
        IF( NSTUCK .GE. N3 ) GOTO 500
        GOTO 100
C
C ANNEALING COMPLETED
 500    RETURN
C
        END
```

FIG. 34

```
      SUBROUTINE GENMOV(RAN,NCHIPS,IPOS,MOVED,NMOVED)
C
C GENMOV GENERATES A RANDOM INTERCHANGE
C
      INTEGER NCHIPS,IPOS(2,1),MOVED(1),NMOVED
      REAL RAN(2)
C
      I = NCHIPS*RAN(1) + 1
      J = NCHIPS*RAN(2) + 1
      IF( I.EQ.J ) GOTO 100
C
C PUT MOVE INTO IPOS IN ORDER TO CALCULATE NEW LIMITS
      CALL IPSWAP(IPOS,I,J)
      NMOVED = 2
      MOVED(1) = I
      MOVED(2) = J
      RETURN
C
C MOVE NOT ACCEPTABLE
  100 NMOVED = 0
      RETURN
      END
```

FIG. 35

```
      FUNCTION NEWSCR(MOVED,NMOVED,IPOS,IPARAM,NETLIM,IJLIST,IJL,IJLIM,
     1      IJLMAX,HISTX,HISTY,NHISTX,NHISTY)
C
C NEWSCORE CALCULATES THE 'SCORE' CORRESPONDING TO THE NEW POSITION
C
      INTEGER MOVED(1),NMOVED,IPOS(2,1),IPARAM(1),NETLIM(4,1)
      INTEGER IJLIST(1),IJL,IJLIM(4,1),IJLMAX
      INTEGER HISTX(1),HISTY(1),NHISTX(1),NHISTY(1)
      REAL NEWSCR,SCORIT
C
      COMMON /NETCM1/ NCLIST(10000),NNLIST(10000)
      COMMON /NETCM2/ NNETS,NCHIPS,NCPTR(5001),NNPTR(5001),
     1    NROWS,NCOLS
      INTEGER NCLIST,NNLIST,NNETS,NCHIPS,NCPTR,NNPTR,NROWS,NCOLS
C
C LOCAL STORAGE
      INTEGER DHX(10),DHY(10)
C
      I = MOVED(1)
      J = MOVED(2)
C SET UP LIST OF NETS CONNECTED TO EITHER CHIP I OR CHIP J
      IO = NNPTR(I)
      NI = NNPTR(I+1) - IO
      JO = NNPTR(J)
      NJ = NNPTR(J+1) - JO
      CALL DISJ(NNLIST(IO),NI,NNLIST(JO),NJ,IJLIST,IJL,IJLMAX)
C
C CALCULATE CHANGE IN NET BOUNDING RECTANGLES, AND THE RESULTING
C     HISTOGRAM CHANGES
      CALL LIMITS (NCLIST,NCPTR,IPOS,IJL,IJLIST,IJLIM)
      CALL DHXY (NETLIM,IJLIST,IJL,IJLIM,DHX,DHY)
C
C CALCULATE NEW HISTOGRAMS OF NET CROSSINGS
      ISUMX = 0
      DO 100 K=1,NCOLS
      ISUMX = ISUMX + DHX(K)
      NHISTX(K) = HISTX(K) + ISUMX
  100 CONTINUE
      ISUMY = 0
      DO 110 K=1,NROWS
      ISUMY = ISUMY + DHY(K)
      NHISTY(K) = HISTY(K) + ISUMY
  110 CONTINUE
      NEWSCR = SCORIT(IPARAM,NROWS,NCOLS,NHISTX,NHISTY)
      RETURN
C
      END
```

FIG. 36

```
      SUBROUTINE KEEPMV(NROWS,NCOLS,NHISTX,NHISTY,HISTX,HISTY,
     1      IJLIST,IJL,IJLIM,NETLIM)
C
C KEEPMV UPDATES ARRAYS TO REFLECT THAT A MOVE HAS BEEN ACCEPTED
C
      INTEGER NROWS,NCOLS,NHISTX(1),NHISTY(1),HISTX(1),HISTY(1)
      INTEGER IJLIST(1),IJL,IJLIM(4,1),NETLIM(4,1)
C
      DO 100 K=1,NCOLS
      HISTX(K)=NHISTX(K)
  100 CONTINUE
      DO 110 K=1,NROWS
      HISTY(K)=NHISTY(K)
  110 CONTINUE
C
C UPDATE NETLIM TO REFLECT THE ACCEPTED MOVE
      IF(IJL.LE.0) GOTO 130
      DO 120 I=1,IJL
      INET=IJLIST(I)
      DO 120 M=1,4
  120 NETLIM(M,INET)=IJLIM(M,I)
C
  130 RETURN
      END
```

FIG. 37

```
      SUBROUTINE DROPMV(MOVED,NMOVED,IPOS)
C
C DROPMV UNDOES A MOVE THAT HAS NOT BEEN ACCEPTED
C
      INTEGER MOVED(1),NMOVED,IPOS(2,1)
C
      I = MOVED(1)
      J = MOVED(2)
      CALL IPSWAP(IPOS,I,J)
      RETURN
      END
```

FIG. 38

```fortran
      SUBROUTINE DISJ(ALIST,NA,BLIST,NB,CLIST,NC,NCMAX)
C
C THIS SCANS TWO SORTED (SMALLEST FIRST) LISTS, ALIST AND BLIST,
C IGNORING THE ENTRIES WHICH ARE COMMON TO THE TWO
C THE RESULTING PRUNED LIST OF NC ENTRIES GOES INTO CLIST
C
      INTEGER ALIST(1),NA,BLIST(1),NB,CLIST(1),NC,NCMAX
C
      I1 = 1
      J1 = 1
      I2 = NA + 1
      J2 = NB + 1
      NC = 0
C
C MERGE THE TWO LISTS
C
 100  IF (I1.EQ.I2) GOTO 120
      IF (J1.EQ.J2) GOTO 130
      K = ALIST(I1) - BLIST(J1)
      IF (K.NE.0) GOTO 110
C
C ELEMENT IS SHARED, IGNORE IT
C
      I1 = I1 + 1
      J1 = J1 + 1
      GOTO 100
C
C PICK THE SMALLEST ELEMENT AND ADD TO LIST
C
 110  IF (K.LT.0) GOTO 115
      NC = NC + 1
      IF( NC .GT. NCMAX ) GOTO 1000
      CLIST (NC) = BLIST(J1)
      J1 = J1 + 1
      GOTO 100
 115  NC = NC + 1
      CLIST (NC) = ALIST(I1)
      I1 = I1 + 1
      GOTO 100
C
C OUT OF I-CHIP NETS
C
 120  IF (J1.EQ.J2) RETURN
      J2M1 = J2-1
      DO 125 JJ = J1,J2M1
      NC = NC + 1
      IF( NC .GT. NCMAX ) GOTO 1000
 125  CLIST (NC) = BLIST (JJ)
      RETURN
C
C END OF J-CHIP NETS
C
```

FIG. 39

```
  130  IF (I1.EQ.I2) RETURN
       I2M1 = I2-1
       DO 135 II = I1,I2M1
       NC = NC + 1
       IF( NC .GT. NCMAX ) GOTO 1000
  135  CLIST (NC) = ALIST (II)
       RETURN
C
C DIMENSION OF CLIST EXCEEDED
 1000  WRITE(6,1010) NCMAX
 1010  FORMAT(/' DISJ: DIMENSION OF CLIST (',I6,') EXCEEDED.')
       STOP 16
       END
```

FIG. 40

```
      SUBROUTINE LIMITS(NCLIST,NCPTR,IPOS,IJL,IJLIST,IJLIM)
C
C LIMITS CALCULATES THE NEW NET-LIMITS FOR NETS AFFECTED BY A MOVE
C
      INTEGER NCLIST(1),NCPTR(1)
      INTEGER IPOS(2,1)
      INTEGER IJLIST(1),IJL,IJLIM(4,1)
C
C IJLIST WAS FILLED BY CALL TO DISJ, GIVEN LIST OF NETS FOR I AND J.
C     IT CONSISTS OF A SORTED LIST OF NETS WHICH ARE CONNECTED
C     TO I OR J BUT NOT TO BOTH I AND J.
C
C IJLIM  - ARRAY OF XMAX,XMIN,YMAX,YMIN FOR EACH NET, GIVEN IPOS
C
      IF (IJL.EQ.0) RETURN
      DO 100 II=1,IJL
C
C FIND NEXT NET IN IJLIST
C
      I = IJLIST(II)
      J1 = NCPTR(I)
      N = NCPTR(I+1) - J1
C
C SCAN ALL CHIPS ON THIS NET
C
      CALL VLIMS (NCLIST(J1), N, IPOS, IJLIM(1,II))
C
C RESULTS ARE SAVED IN IJLIM(1...4,II)
C
  100 CONTINUE
      RETURN
      END
```

FIG. 41

```
      SUBROUTINE VLIMS(NCLIST,N,IPOS,IJLIM)
C
C THIS IS KERNEL OF THE LIMITS ROUTINE: GIVEN A LIST OF N CHIPS ON
C A GIVEN NET, SCAN ALL CHIP POSITIONS, AND STORE XMAX, XMIN, ETC,
C IN IJLIM(1,...4)
C
      INTEGER NCLIST(1),N,IPOS(2,1),IJLIM(4)
      INTEGER XMAX,XMIN,X,YMAX,YMIN,Y
C
      IF (N.EQ.0) RETURN
      K = NCLIST(1)
      XMAX = IPOS(1,K)
      XMIN = XMAX
      YMAX = IPOS(2,K)
      YMIN = YMAX
      IF (N.EQ.1) GOTO 100
C
C SCAN ALL CHIPS ON THIS NET
C
      DO 90 J = 2,N
      K = NCLIST(J)
      X = IPOS (1,K)
      Y = IPOS (2,K)
      IF (X.LE.XMAX) GOTO 91
      XMAX = X
      GOTO 92
 91   IF (X.GE.XMIN) GOTO 92
      XMIN = X
 92   IF (Y.LE.YMAX) GOTO 93
      YMAX = Y
      GOTO 90
 93   IF (Y.LT.YMIN) YMIN = Y
 90   CONTINUE
C
C SAVE IN IJLIM
C
 100  IJLIM(1) = XMAX
      IJLIM(2) = XMIN
      IJLIM(3) = YMAX
      IJLIM(4) = YMIN
      RETURN
      END
```

FIG. 42

```
      SUBROUTINE DHXY (NETLIM,IJLIST,IJL,IJLIM,DHX,DHY)
C
C THIS CALCULATES CHANGES IN HISTOGRAMS OF WIRE DENSITIES, PROJECTED
C IN THE X AND Y DIRECTIONS, FOR A GIVEN CONFIGURATION, DESCRIBED
C BY THE POSITION LIST IPOS, AND A LIST OF IJL NETS WHOSE X AND Y LIMITS
C ARE IN IJLIM, AND THEIR NET NOS IN IJLIST.
C
      INTEGER NETLIM(4,1),IJLIST(1),IJL,IJLIM(4,1)
      INTEGER DHX(1),DHY(1)
      COMMON /NETCM1/ NCLIST(10000),NNLIST(10000)
      COMMON /NETCM2/ NNETS,NCHIPS,NCPTR(5001),NNPTR(5001),
     1 NROWS,NCOLS
      INTEGER NNETS,NCHIPS,NCLIST,NCPTR,NNLIST,NNPTR
C LOCAL VARIABLES
      INTEGER XMAX,XMIN,YMAX,YMIN
C
      IF (IJL.EQ.0) RETURN
      DO 10 I=1,NCOLS
  10  DHX(I) = 0
      DO 20 I=1,NROWS
  20  DHY(I) = 0
      DO 100 II=1,IJL
C
C FIRST CALCULATE CONTRIB OF NETS AFTER MOVE
C
      XMAX = IJLIM(1,II)
      XMIN = IJLIM(2,II)
      YMAX = IJLIM(3,II)
      YMIN = IJLIM(4,II)
      DHX(XMIN) = DHX(XMIN) + 1
      DHX(XMAX) = DHX(XMAX) - 1
      DHY(YMIN) = DHY(YMIN) + 1
      DHY(YMAX) = DHY(YMAX) - 1
C
C NOW SUBTRACT OLD CONTRIBUTION
C
      I = IJLIST(II)
      XMAX = NETLIM(1,I)
      XMIN = NETLIM(2,I)
      YMAX = NETLIM(3,I)
      YMIN = NETLIM(4,I)
      DHX(XMIN) = DHX(XMIN) - 1
      DHX(XMAX) = DHX(XMAX) + 1
      DHY(YMIN) = DHY(YMIN) - 1
 100  DHY(YMAX) = DHY(YMAX) + 1
      RETURN
      END
```

FIG. 43

```
      SUBROUTINE IPSWAP (IPOS,I,J)
C
C IPSWAP SWAPS THE LOCATION OF TWO CIRCUITS
C
      INTEGER IPOS(2,1)
C
      IX = IPOS(1,I)
      IY = IPOS(2,I)
      JX = IPOS(1,J)
      JY = IPOS(2,J)
      IPOS(1,I) = JX
      IPOS(2,I) = JY
      IPOS(1,J) = IX
      IPOS(2,J) = IY
C
      RETURN
      END
```

FIG. 44

```fortran
      REAL FUNCTION SCORIT(IPARAM,NROWS,NCOLS,NHISTX,NHISTY)
C
C FUNCTION TO CALCULATE A SCALAR SCORE FOR A PAIR EXCHANGE BASED ON
C   NUMBER OF NETS CROSSING BOUNDARIES
C
      INTEGER NHISTX(1),NHISTY(1)
      INTEGER IPARAM(1),XPLAT,LAMDAX,YPLAT,LAMDAY
      INTEGER LEN,XSUM,YSUM
C
      LEN = 0
      XSUM = 0
      YSUM = 0
      XPLAT = IPARAM(1)
      YPLAT = IPARAM(3)
      LAMDAX = IPARAM(2)
      LAMDAY = IPARAM(4)
C SCORE ON TOTAL LENGTH AND ON LINES ABOVE PLATEAU
      DO 10 K=1,NCOLS
         LEN = LEN + NHISTX(K)
         IF( NHISTX(K) .GT. XPLAT ) XSUM = XSUM + (NHISTX(K)-XPLAT)**2
   10 CONTINUE
      DO 20 K=1,NROWS
         LEN = LEN + NHISTY(K)
         IF( NHISTY(K) .GT. YPLAT ) YSUM = YSUM + (NHISTY(K)-YPLAT)**2
   20 CONTINUE
C
      SCORIT = LEN + XSUM/LAMDAX + YSUM/LAMDAY
C
      RETURN
      END
```

FIG. 45

```
      SUBROUTINE NEWLIM(IJLIST,IJL,IJLIM,NETLIM)
C
C NEWLIM COPIES THE NEW NET LIMITS FROM IJLIM TO NETLIM
C
      INTEGER IJLIST(1),IJL,IJLIM(4,1),NETLIM(4,1)
C
      IF(IJL.LE.0) GOTO 20
      DO 10 I=1,IJL
      INET=IJLIST(I)
      DO 10 M=1,4
 10   NETLIM(M,INET)=IJLIM(M,I)
C
 20   RETURN
      END
```

FIG.46

```
************ GGL2 ********* VERSION 1, MODIFICATION LEVEL 1 **** DK010153 ***
*                                                                           *
*         THIS SUBROUTINE GENERATES PSEUDO-RANDOM NUMBERS BY THE             *
*         ALGORITHM:  IX(I+1)=A*IX(I), A=7**5, P=2**31-1.                    *
*         IT MAY BE INVOKED FROM A FORTRAN PROGRAM BY THE STATEMENT:         *
*         CALL GGL2 (IX,X,N)                                                 *
*         WHERE IX= ANY INTEGER*4 VARIABLE (IX>0)                            *
*               X = ANY REAL*4 ARRAY OF DIMENSION >= N                       *
*               N = ANY INTEGER*4 VARIABLE (N>=1), THE NUMBER OF REAL        *
*                   RANDOM NUMBERS TO BE GENERATED AND PLACED IN X           *
*         THE STATEMENT                                                      *
*         CALL SPIE                                                          *
*         MUST BE EXECUTED ONCE PRIOR TO THE FIRST CALL OF GGL2              *
*         TO SET A HARDWARE TEST FOR FIXED POINT OVERFLOW                    *
*         5736-XM7 COPYRIGHT IBM CORP. 1971                                  *
*         REFER TO INSTRUCTIONS ON COPYRIGHT NOTICE FORM NO. 120-2083        *
*         FE SERVICE NO. 200281                                              *
*                                                                            *
******************************************************************************
*
SPIE      CSECT
          ENTRY GGL2
          USING SPIE,12
          SAVE  (14,12),,5736-XM7/COPYRIGHT/IBM/CORP./1971.200281
          LR    12,15
          ST    13,SAVEAREA+4
          LR    2,13
          LA    13,SAVEAREA
          ST    13,8(2)
          SPIE  MF=(E,FSPIE)        FIRST SPIE LOCATES FORTRAN PICA
          ST    1,FORTPICA     SAVE FORTRAN PICA ADDRESS
          OC    FSPIE(1),0(1)  OR FORTRAN'S PROGRAM MASK AND INTERRUPT
          OC    FSPIE+4(2),4(1) MASK INTO OUR PICA.
          SPACE
* RESET FORTRAN'S INTERRUPT TYPES; SPECIFY OUR EXIT ROUTINE ADDRESS;
* TURN ON FLAGS FOR FIXED-POINT OVERFLOW FOR OUR FIXUP ROUTINE.
          SPACE
          SPIE  MF=(E,FSPIE)        ISSUE UPDATED SPIE
          L     13,SAVEAREA+4  TERMINAL LINKAGE
          RETURN (14,12),T
*
*
          USING EXIT,15
EXIT      TM    8(1),X'C0'     DETERMINE IF INTERRUPT IS PRECISE OR
*                              IMPRECISE. ILC=0?
          BC    5,PRECISE      IF NO, BRANCH TO 'PRECISE'
*                              IMPRECISE INTERRUPT
          TM    6(1),X'08'     FIXED POINT OVERFLOW?
          BZ    FORTSPIE       IF NO, GIVE CONTROL BACK TO FORTRAN
          CLC   17(3,1),AGGL+1 DOES THE BASE REGISTER POINT TO GGL2?
          BNE   0(0,14)        IF NO, IGNORE (FORTRAN DOES NOT HANDLE
*                                      FIXED POINT OVERFLOW)
*
*
* DETERMINE LAST INSTRUCTION EXECUTED AFTER OVERFLOW AND MAKE
*              APPROPRIATE CORRECTION
* (THE ADDRESSES REFERRED TO HERE ARE FOR INSTRUCTIONS IN THE LOOP IN
*              'GGL')
```

FIG. 47

```
             LA      8,0(8)
             C       8,ALR           COMPARE PSW AND LR ADDRESSES
             BNL     IOK             IF PSW>=LR, BRANCH TO 'IOK'
             C       8,ALOOP         COMPARE PSW AND MR ADDRESSES
             BE      IM4             IF EQUAL, BRANCH TO 'IM4' TO REDUCE I
             C       8,ASRL          COMPARE PSW AND FIRST SRL ADDRESSES
             BL      UMR             IF PSW<SRL, BRANCH TO UNDO MR
             BE      USLDA           IF PSW=SRL, BRANCH TO UNDO SLDA
             SLL     5,1             UNDO SRL
USLDA        SRDA    4,1             UNDO SLDA
UMR          DR      4,9             UNDO MR
IM4          SR      I,INC           REDUCE I BY 4
FIXUP        A       5,PM2           THE CORRECTION, ADD 2**31+1 TO R5 (Q+R),
             AR      5,INC              IS INDIRECT (TO AVOID OVERFLOW)
             LR      4,5             PUT CORRECTED IX IN R4 FOR TRANSFORMATION
*                                       TO X
             MVC     9(3,1),BSRL+1   INSERT SECOND SRL ADDRESS IN OLD PSW
             BR      14              RETURN TO INTERRUPT HANDLER
IOK          BH      JOK             IF PSW>LR, BRANCH TO 'JOK'
             LR      5,4             PUT R5=R4 SINCE CORRECTION IS MADE TO R5
             B       FIXUP
JOK          C       8,AL            COMPARE PSW AND L(AFTER BXLE) ADDRESSES
             BL      FIXUP           IF PSW<L, BRANCH TO 'FIXUP'
             B       IM4             IF PSW>=L, BRANCH TO 'IM4'
*
PRECISE      TM      7(1),X'F7'      FIXED POINT OVERFLOW?
             BC      5,FORTSPIE      IF NO, GIVE CONTROL BACK TO FORTRAN
             CLC     17(3,1),AGGL+1  DOES THE BASE REGISTER POINT TO GGL2?
             BNE     0(0,14)         IF NO, IGNORE (FORTRAN DOES NOT HANDLE
*                                       FIXED POINT OVERFLOW)
             A       4,PM2           THE CORRECTION, ADD 2**31+1 TO R4 (Q+R),
             AR      4,INC              IS INDIRECT (TO AVOID OVERFLOW)
             BR      14              RETURN TO INTERRUPT HANDLER
*
FORTSPIE     L       15,FORTPICA     LOAD FORTRAN PICA ADDRESS IN R15
             L       15,0(15)        LOAD FORTRAN SPIE EXIT ROUTINE ADDRESS
*                                       IN R15
             BR      15              BRANCH TO FORTRAN SPIE EXIT ROUTINE
*
*
             USING   *,15
GGL2         SAVE    (14,12),,*      INITIAL LINKAGE
             ST      13,SAVEAREA+4
             LR      2,13
             LA      13,SAVEAREA
             ST      13,8(2)
INC          EQU     2
N            EQU     3
FLB          EQU     6
I            EQU     7
A            EQU     9
CHAR         EQU     10
COMP         EQU     11
             SUR     0,0             FLR0=0.
             LM      A,COMP,DCA      LOAD A,CHAR AND NORM. COMPARAND IN R9-R11
             LA      INC,4           INCREMENT=4 BYTES (1 WORD)
             LM      5,7,0(1)        R5-R7 CONTAIN ADDRESSES OF IX,X,N
```

FIG. 48

```
            SLA    N,2              R3=4*N
            SR     FLB,INC          R6=ADDRESS OF WORD BEFORE X
            LR     I,INC            I=4 INITIALLY
            LA     12,NONORM        R12=ADDRESS OF BXLE INSTRUCTION
            CNOP   2,8              POSITION START OF LOOP FOR BEST TIMING
LOOP        MR     4,A              (R4,R5)=A*IX
            SLDA   4,1              SIMULATE DIVISION BY P(=2**31-1)
ISRL        SRL    5,1                  A*IX=Q*P+R      R4=R, R5=Q
            AR     4,5              R4=Q+R= NEXT INTEGER RANDOM NUMBER IX
ILR         LR     5,4              SAVE NEW IX IN R5 FOR NEXT TIME THRU LOOP
JSRL        SRL    4,7              GENERATE FLOATING POINT RANDOM NUMBER ,X,
            OR     4,CHAR               FROM IX
            ST     4,0(I,FLB)       STORE X
            CR     4,COMP           X<COMP?
            BCR    11,12            IF NO, BRANCH TO 'NONORM'
            LE     2,0(I,FLB)       NORMALIZE X
            AER    2,0
            STE    2,0(I,FLB)
NONORM      BXLE   I,INC,LOOP       TEST IF N RANDOM NUMBERS ARE GENERATED
IL          L      4,0(0,1)         R4=ADDRESS OF IX
            ST     5,0(0,4)         STORE LAST VALUE OF IX IN CALLING ROUTINE
            L      13,SAVEAREA+4    TERMINAL LINKAGE
            RETURN (14,12),T
FORTPICA    DC     F'0'             CONSTANTS
AGGL        DC     A(GGL2)
ALOOP       DC     A(LOOP)
ASRL        DC     A(ISRL)
ALR         DC     A(ILR)
BSRL        DC     A(JSRL)
AL          DC     A(IL)
PM2         DC     F'2147483645'    P=2**31-1, PM2=2**31-3
DCA         DC     F'16807'         A=7**5
DCCHAR      DC     X'40000001'      THE 1 ASSURES THAT X>0.
DCCOMP      DC     X'40100000'      NORMALIZATION COMPARAND
SAVEAREA    DS     18F
FSPIE       SPIE   EXIT,(8),MF=L        GGL2 CHANGES TO FORTRAN SPIE
            END
```

FIG. 49.1
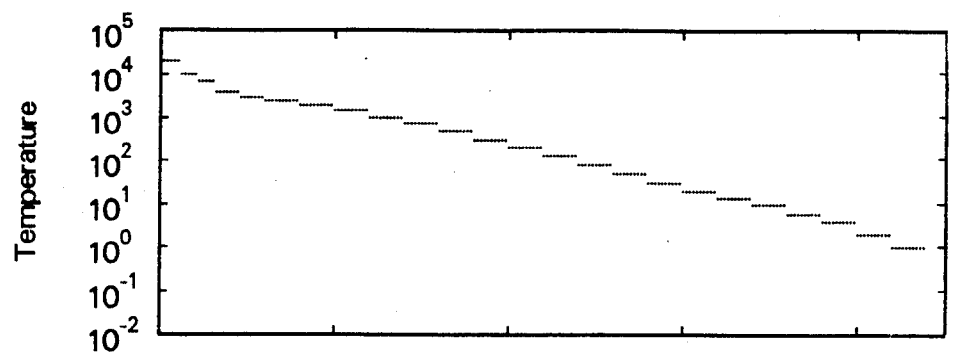
FIG. 49.2
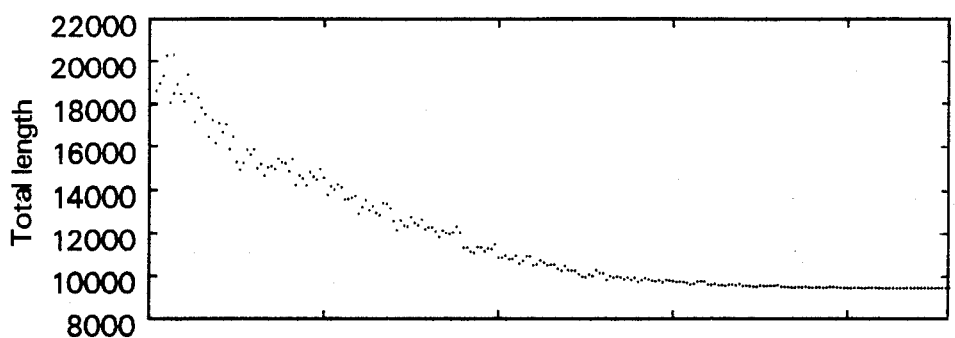
FIG. 49.3
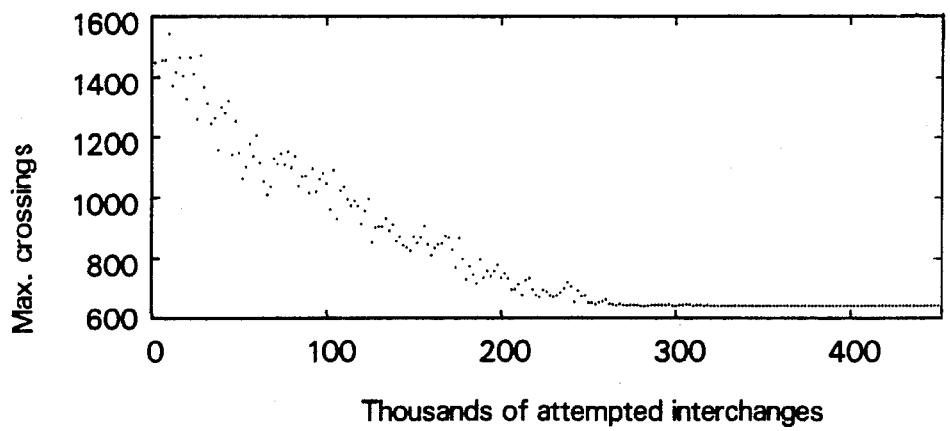
Thousands of attempted interchanges FIG. 52
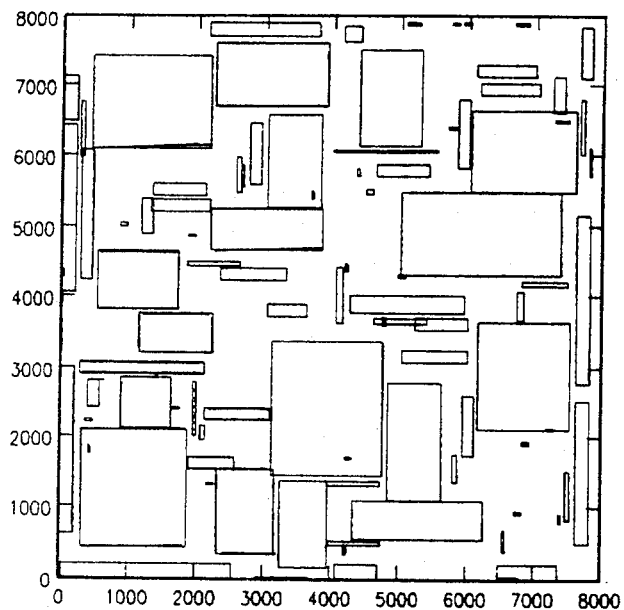
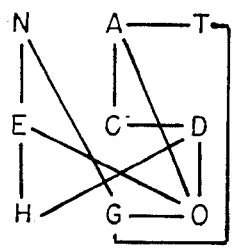
TABLE 1
FIG. 53
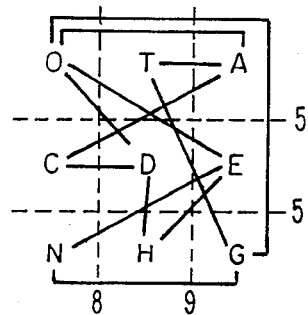
TABLE 2
FIG. 54
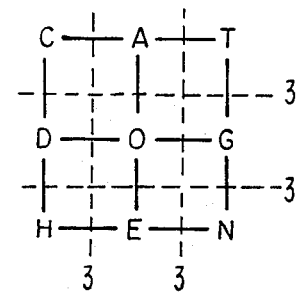
TABLE 3
FIG. 55

OPTIMIZATION OF AN ORGANIZATION OF MANY DISCRETE ELEMENTS

TECHNICAL FIELD

The technical field of the invention involves the producing of an optimized arrangement of a number of discrete factors, the interrelationship of which affects such properties as the final usefulness of the design or the space it occuples. In such a design, each individual factor has an interrelated performance with respect to the other factors based on a plurality of size and operational constraints.

As an illustration of this, as the complexity of physical designs has advanced, it has become necessary to employ the digital computer to assist in handling the many variables and a technical field known as computer aided design has developed.

The problem of generating in an acceptable technology a specific hardware implementation from a functional description has been receiving much computer aided design attention. The nature of each problem depends on the detail of the functional description, the implementation constraints and the criteria for what constitutes an acceptable arrangement.

The design, fabrication and testing of actual devices is the best way to discover all of the implementation problems and limitations in any new technology. It is, however, a time-consuming approach, and, as the number of interrelated items grows, situations are being encountered in today's technology where the cost and the time constraints cannot permit exploring all possible arrangements of the interrelated items.

The best example of such a situation in today's technology is that of the very large scale integration of semiconductor devices. Presently, it may cost over a million dollars to fabricate a single production unit or lot of devices and over six months are usually required to complete them.

In producing physical designs in this type of environment, computer aided design is employed as a substitute for the costly manual investigations that are normally required to optimize a new process or device structure. The very large scale integration technologies in the semiconductor field are such that there is a statistical nature to design which makes them particularly adaptable to computer aided design. The large numbers of devices on a single integrated circuit chip in today's technology make this type of design imperative.

BACKGROUND ART

The task of the assembly of complex physical designs such as device placement in semiconductor chip layouts has been approached in the art in a number of ways. In U.S. Pat. No. 3,654,615, an algorithm is set forth for chip placement and network routing which assigns a first element and then sequentially selects each remaining one until all are assigned, testing each assignment for the incremental effect thereof with respect to the overall array.

The difficulty, however, with such approaches to the design optimization problem that involve measuring improvement attempts over each previous improvement attempt serially is that as the number interrelated discrete elements rises, there will be points where all local rearrangements will operate to make the overall solution worse and the design improvement gets stuck at individual places that may be far from optimum.

In another U.S. Pat. No. 3,621,208 an algorithm that provides trial and error that progresses from the longest to the shortest wire is set forth. This type of technique also occasionally gets stuck at a point that is not acceptable.

While in many instances, such approaches give fairly good results, an approach has not appeared in the art heretofore that will invariably handle the problem of becoming stuck, since the approach to an optimum design rarely flows smoothly from one point to another.

BRIEF DESCRIPTION OF THE DRAWINGS

FIGS. 5 through 17 are individual elements of the flow chart.

FIGS. 18 through 48 are the instructions of a program usable to implement the invention.

FIGS. 49.1, 49.2 and 49.3 are a series of three correlated graphs illustrating the improvement gained with the invention.

FIGS. 50, 51 and 52 are design improvement illustrations indicating device area overlap reduction.

FIGS. 53, 54 and 55 are illustrations of the improvement in rearrangement of nine devices in accordance with the invention.

DISCLOSURE OF THE INVENTION

Figure 1:
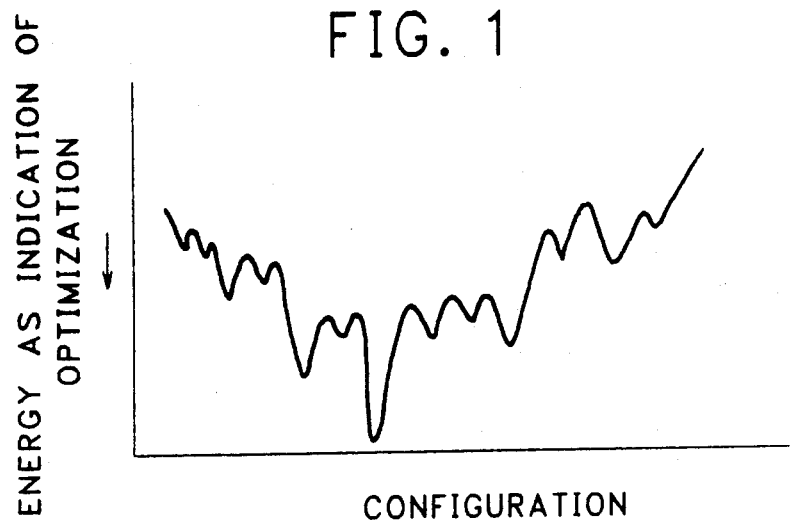
FIG. 1 is a schematic graph illustrating the presence of localized optima and an overall optimum encountered as incremental configuration changes are made.

In assembling a physical design of a plurality of discrete elements, each element of which is limited by a number of constraints, but where the overall configuration of those elements is related to the usefulness of the complete physical design, an optimization in accordance with the invention can be achieved by handling the physical design as a sequence of localized optimization problems within an overall trend.

The approach of the invention permits measured localized departures at sticking points without losing track of overall progress.

For uniformity of terminology, the following definitions of a number of terms have been employed.

Element—a discrete object or device that is to be interrelatedly combined in an organized unit.

Configuration—an interrelated arrangement of discrete elements organized as a unit.

Interrelationship—the manner that the elements cooperate in the configuration.

Usefulness specification—a measure of the suitability of the configuration being optimized for the desired purpose. As examples in some types of problems, cost is a factor to be minimized, in others energy is an indirect measure of cost, and in still others, the quantity of objects per given area or volume is maximized as another indirect measure of cost.

Generalized rule is a function that takes as input the change in the usefulness specification that results from a change in the configuration and provides as output the probability that this change will be accepted.

Simulated annealing is a systematic sequence of changes in the generalized rule and a specification of the number of local changes to be attempted after each modification of the generalized rule. The systematic sequence of changes involves two directions. The first or warming direction is a progressive increase in the probability of accepting local changes which evaluate as not being an improvement in said usefulness specification The second or cooling direction is a progressive decrease in the probability of accepting local changes which evaluate as not being an improvement in said usefulness specification.

Objective function—a value or set of values as a score of the relationship of a particular configuration to the usefulness specification.

Local change—a modification of a portion of the elements and interrelationships in the configuration.

Acceptability modification trend—a progressive variation of the criteria by which a proposed change in the configuration is accepted or rejected.

The physical design configuration is measured and scored with respect to a usefulness specification. As changes are made to the configuration, there may be very many local optima and many nearly equivalent overall optima and the probability of the acceptability of proposed changes is governed by an overall trend.

The technique of the invention employs the principles of statistical mechanics and uses a method similar to the method set forth by Metropolis et al that was applied to atomic particles and set forth in the Journal of Chemical Physics, Vol. 21, No. 6, June 1953, page 1087.

The technique of the invention employs a general incremental procedure within an overall trend which avoids being trapped in local optima yet permits the use of complicated non-analytic scoring or objective functions.

In accordance with the invention, four interdependent elements are required. For the first element, it is necessary that a means be provided for defining or describing the physical design configuration. This element need only be detailed enough so that localized changes in the physical design can be distinguished. For the second element, a means is provided for introducing local changes to individual or individual combinations of discrete elements in the configuration. For the third element, a usefulness measurement or objective function for the configuration being optimized is provided in order to be able to measure the effect of any changes on meeting the usefulness specification or the overall suitability of the physical design configuration. And lastly, for the fourth element, a trend is applied to all elements in the overall physical design that affects the probability of acceptance of a local change. There is a prescription for defining the probability of acceptance of a local change. The most important aspect of that prescription is the ratio of a first number that is the fraction of local changes which worsen the objective functlon and which are accepted and a second number which is the fraction of local changes that improve the objective function and are accepted. The trend is a systematic variation of this ratio.

The preferred illustration of the incremental trend is a simulation of a temperature versus time or annealing schedule where heat which increases or decreases according to an overall general rule is applied in small increments uniformly to all elements of the configuration. Under the laws of statistical mechanics the consequence of heat is that the probability of a system increasing its energy by $\Delta E$ is proportional to exp $-\Delta E/T$ where T is the temperature in absolute units. In the invention the objective function serves the role of the energy and the systematic variation of the acceptance prescription corresponds to the systematic variation in temperature.

The third element, the objective function, may be provided with a wide range of capabilities which produce attendant advantages all related to satisfying a usefulness specification for the configuration.

In complex operations, such as semiconductor chip placement in a mounting package or device placement on a semiconductor chip, the objective function further will contain information about a number of factors of differing weight, such as wire or net length, wiring congestion and power dissipation. These may permit the objective function also to insure that the final configuration however optimum for some purposes, such as use of area, does not violate other constraints. For example, in integrated circuit placement, one clear overriding rule is that subsystems or large assemblies called macros cannot overlap.

This flexibility of criteria capability on the part of the objective function will permit use of a simple local-change or move-generator operation. The simulation operations can thus be carried out using fairly simplistic local changes with the effect on the overall configuration merely measured using the objective function.

For the fourth element in the annealing analog, a pseudo temperature trend or schedule is applied to modify the probability of accepting proposed changes in the configuration.

Early in such an annealing process at a sufficiently high temperature most local moves will be considered acceptable regardless of whether they lead to more or less optimal configurations. The annealing schedule will determine how long to spend at each temperature.

As the overall energy of the system is reduced, at the simulated lower temperatures, changes in the objective function in the direction of improvement will always be accepted whereas changes that worsen the objective function will be accepted less and less often.

In order to facilitate the ability of one skilled in the art to employ the principles of the invention, the following description is provided of the actual arrangement of nine semiconductor circuit devices into a 3×3 array wherein in an optimized configuration each circuit device will be positioned so that the wiring is simplified to the point where all interconnections are to the adjacent neighboring devices thereby permitting closer packing and higher response rates due to the elimination of crossover and long distance wiring.

For ease of following the description, each of the circuit devices is assigned a letter and an interconnection is shown as a line. An arbitrary initial configuration would be as shown in FIG. 53.

It will be apparent that substantial wiring congestion and crossing will be required for the array configuration of FIG. 53.

In accordance with the invention, the array configuration will have the letter designated devices interchanged iteratively in a movement toward optimization by first providing a description of the configuration so that changes can be identified, second providing a means to introduce changes on individual or subgroups of devices, third scoring the effect of changes with respect to the overall goal of the use of the arrays, in this case the wiring simplification, and fourth accepting or rejecting the change based on the change in score as compared to a simulated temperature.

The first item of the invention, the description of the configuration, is provided by the address locations of the devices; the second item of the invention, the changes, are generated by interchanging device or subgroup address locations; the third item of the invention, the scoring or objective function measure, is provided by the formation of a list or histogram of wiring crossings for each row and column of the device addresses and counting the crossings; and the fourth item of the invention, the annealing schedule is determined by an algorithm that considers the number of elements to be moved and the fraction of proposed changes that were accepted at the current temperature.

Following this approach, in accordance with the invention, an intermediate configuration for the 9 device example of FIG. 53 would be as shown in FIG. 54 wherein the crossing counts for the histogram entries are shown along dotted lines.

An optimized placement where the goal is wiring simplification would occur when the devices were so positioned that the only connections shown in the histograms were the single connection to the adjacent neighbor which would in turn be the number of devices in a line in the array. The optimum configuration and histogram entries would then be as shown in FIG. 55.

It will be clear to one skilled in the art that the technique of the invention of applying localized changes subject to a predictable overall trend results in the ability to tolerate interim worsening in the score or objective function. In other words, it permits moves that either increase or decrease the objective function in order to prevent the configuration from becoming stuck at a local optima, and will permit substantial variations in extremely complex arrangements in attempt to avoid sticking situations without losing overall track of progress.

The technique of the invention is applicable to the optimization of any arrangement of discrete objects such as for example optimizing routing, logic circuit partitioning, bin-packing and project scheduling types of problems.

In the optimizing routing type of problem, a sequence of deliveries, such as with a milk truck, is configured as a group of houses in the order in which deliveries are made. Moves are randomly generated by taking subsequences of houses and shifting them to another place in the list, possibly reversing their order front-to-back. The overall score is the length of the route, possibly corrected with factors like the benefit when two adjacent houses are served together so that the driver doesn't have to move his truck. Therefore, in the annealing analog, the temperature would be expressed in units of length.

In the logic circuit partitioning type of problem, the configuration is described by listing, for each current switching member or gate in the logic, the semiconductor integrated circuit chip it is to be placed on. Moves would consist of changing the assignment of a gate from one chip to another. The overall score would be expressed as the number of circuit nets which connect gates on more than one chip with a penalty for crowding more gates on one chip than the area will accommodate. In this type of application of the invention, there may also be penalties which are technology-dependent so as to recognize instances when extra circuits must be added to provide the power to drive a gate on a distant chip.

In the bin-packing or knapsack type problems, consider a collection of boxes, to be fitted into a truck for transport. An optimum arrangement of the boxes is required to maximize the number of boxes that can be fitted into the interior of the truck. The configuration would be described by listing the positions of the centers of the boxes and their dimensions. Moves would consist of shifting a single box from its position to some new position. No boxes are allowed to extend beyond the truck. The extent that they overlap is to be minimized. The score would be the total volume of overlap as set forth in Equation 1.

$$\text{score} = \tfrac{1}{2} \sum_{i \neq j} \text{overlap of } i \text{ with } j. \qquad \text{Equation 1}$$

Stock cutting in which a predefined list of shapes are to be cut from a flat piece of stock is a two-dimensional variant of this class of problem.

In the project scheduling problem, the elements are tasks, with required durations, lists of required predecessors, successors, and dollar or manpower requirements for each.

The specification of the project configuration consists of saying when each task is initiated. Moves consist of shifting a task to an earlier or later time.

The score consists of penalties for: negative slacks—successors beginning before their predecessor tasks are completed; tasks starting before project initiation, or ending after the intended project completion; instantaneous resource requirements which exceed some limits in manpower or cash flow.

Cooling the system to low temperature generates configurations representing feasible schedules, if the assumed properties and interrelationships of the tasks permit.

In all of these examples, the score is really a cost and is to be minimized. The invention is particularly adaptable to handling large arrays with many constraints and criteria through the use of computer technology.

In the route optimization, bin packing and scheduling examples, the output of the practice of the invention is optimal arrangement information and is usable directly. In the circuit wiring examples, the output of the invention may be to print out arrangement information as set forth herein on pages 35 to 37 for use manually. As the size of the problem increases, the output is usually stored in a register in a form that is usable to drive a fabricating machine.

In FIG. 1 a graph is provided showing a typical relationship of the variation of energy or objective function with respect to the configuration as an indication of optimization. In accordance with the invention, it will be noted that with the use of simulated annealing as an acceptability modification trend the optimum sought will be inverted or in other words the lowest value. It will also be noted that there are a number of minor optima and frequently substantial changes in configuration are required before improvement is reestablished.

Best Mode For Carrying Out the Invention

The best mode for carrying out the invention is an optimization of the placement of a number of devices in an array. For example, the devices may be circuits on a semiconductor chip, or structured logic chips may be placed onto many chip carriers, or circuit modular packages may be placed as devices onto a large interconnection back plane or board.

The optimization in accordance with the invention provides an objective function which includes in its capabilities responsiveness to the total lengths of the wire which will be needed to connect up the circuits and responsiveness to the density of wires for which cables or channels will have to be provided between discrete devices. The optimization in accordance with the invention further requires an algorithm in which local changes, in the configuration are proposed and scored, and the proposed changes accepted according to an overall rule that changes that are improvements are always accepted while the probability of accepting changes that result in less optimum configurations depends on a control parameter which is changed systematically as the optimization progresses by following an annealing schedule.

Specifically, an incremented new configuration will be accepted as a step toward optimization with a probability P equal to 1 if $\Delta E$ is calculated to be less than zero. On the other hand, the probability P will be exp $(-\Delta E/T)$ if $\Delta E$ is greater than zero, where T is the current value of the temperature or control parameter.

$$\Delta E = E(C_j) - E(C_i) \qquad \text{eg. 2}$$

where $E(C_j)$ is the objective function value of the incremented configuration and $E(C_i)$ is the objective function value of the present configuration.

Figure 2:
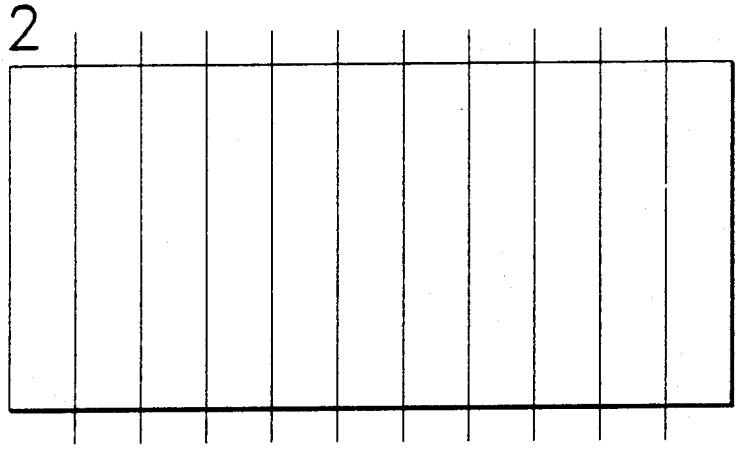
FIGS. 2 and 3 are an illustration of the defining of a congestion criterion for chip placement optimization.
Figure 3:
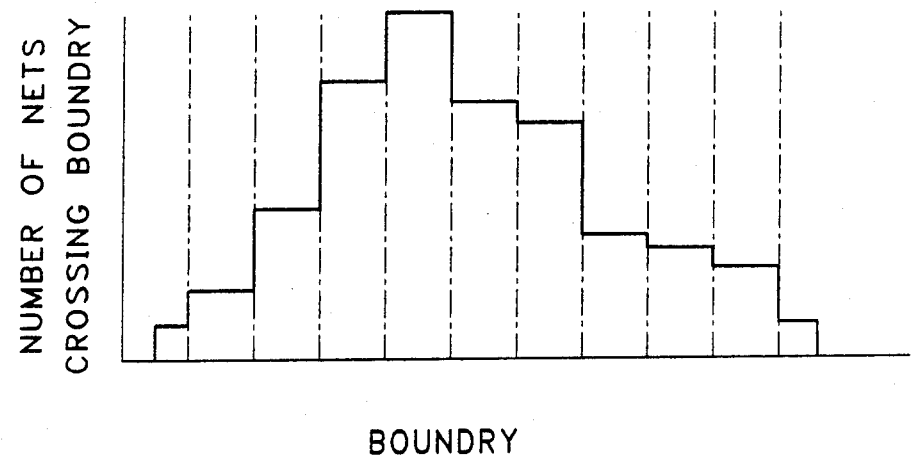

In the preferred embodiment, the simplification of wiring of circuit devices by their placement in an array on a semiconductor chip, the first criterion of the invention, the establishment of a definition for the configuration of the array so that a change can be recognized and evaluated is accomplished as shown in connection with FIGS. 2 and 3.

The area into which the circuits are to be placed is divided into a rectangular grid as shown in one direction in FIG. 2 so that the cells of the grid can be grouped vertically into columns and horizontally in the other direction, which is not shown, into rows.

A descriptive event table given the name histogram, is then constructed in which the element I of the row or horizontal histogram will contain an entry which is the number of conductor nets which connect circuits in the rows above I with circuits in the row I or in the rows below I. Similarly, a column or vertical histogram will be constructed to contain the number of conductor nets which connect circuits in column I or to the left of I with circuits to the right of I. An example of such a column histogram is shown in FIG. 3.

In FIGS. 2 and 3 an illustration of the calculation criteria for an objective function for the placement of individual items in an array of two dimensions is set forth wherein the area is divided in FIG. 2 along the horizontal and vertical dimensions with a plurality of boundary lines for incremental regions. In FIG. 3 a histogram is shown lined up with the boundary lines and shows a number of nets that cross the individual boundaries of FIG. 2 thereby providing a series of horizontal and vertical plateaus. The parameters which will characterize the objective function are $\alpha_x$ and $\alpha_y$ describing the weight given to horizontal and vertical net wire lengths and $\beta_x$ and $\beta_y$ which will describe the weight given to congestion, and a horizontal and vertical threshold height which sets the goal which the largest entries in the horizontal or vertical histogram should not exceed.

The information from the histogram tables can provide information on a number of aspects of the problem. The sum of all entries in the column and the row histograms is a lower bound to the total length of wire needed to connect together the circuits for the given configuration using only horizontal and vertical segments. The largest entry in the respective histograms is a lower bound for the number of wiring channels which must be provided in the horizontal or vertical direction. The histogram entries are often sufficient for the calculation of the objective function.

In the best mode for carrying out the invention, the objective function is taken to be the sum of all entries in both the horizontal and the vertical histograms plus a parameter times the sum over all entries in the horizontal histogram that exceed a horizontal plateau value of the square of the amount by which the entry exceeds the plateau value plus a parameter times the sum over all entries in the vertical histogram that exceed a vertical plateau value of the square of the amount by which the entry exceeds the plateau value.

Random incremental moves are employed to change from one configuration to the next. Two types of moves are usually sufficient. In a first type of move, individual circuits can be inserted into regions which are chosen large enough to hold many circuits at a time. In a second type of move, circuits can be interchanged. In general, any type of move is usable so long as it results in a valid configuration of the ultimate array and is scorable under the objective function. The class of moves must be sufficiently general that any allowed configuration can be reached from any other allowed configuration by a sequence of moves.

Some variation in interchange is possible. Where some of the circuits are of different size and shape, interchanges are generated by selecting a circuit at random and interchanging it within a region of the same size and shape, then moving all other circuits into the region from which the first circuit came. Alignment rules must also be provided to insure that no circuit lies partially in and partially outside the exchange region.

The insertion type of move is mostly useful at the beginning when no guide placement of the circuits is known. This type of move quickly leads to a reasonable rough placement. The interchange type of move becomes more effective with the intermediate and lower annealing temperature values to obtain the final optimal placement.

Figure 4:
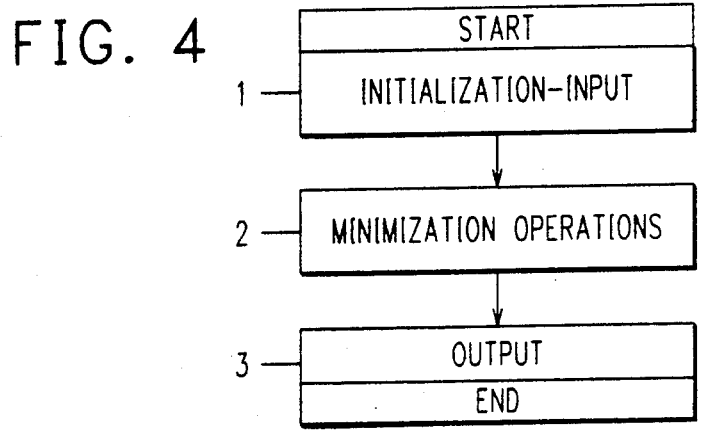
FIG. 4 is a block flow chart of a circuit placement optimization.

In the preferred embodiment being illustrated of the placement of circuits on a chip, in FIG. 4 there is set forth a three section flow chart wherein, in essence, the problem is set up in the first step 1, the incrementing and scoring as influenced by the annealing schedule takes place in the second step 2 and the optimized configuration is delivered in the third step 3 in accordance with standard practice in the art to drive such apparatus as a printer for a paper description of the results.

Referring next to FIG. 5, a detailed description of section 1 of FIG. 4 is provided. There are three general steps in the initialization and input labelled 10 thru 12. The first step labelled 10 involves the reading in of the net list for the array or logical design which is to be improved. A list is set up of circuit elements and functional circuits which will be referred to as objects attached to a net.

In step 11, the second stage, the initial placement of the objects is read in from a file which may be the result of a previous placement, may have been generated according to any set of rules leading to a satisfactory placement of all the objects or as previously discussed it may be an arbitrary assignment followed by a routine of insertion type moves. This establishes an array of locations x and y for each object.

In the third step, 12, the parameters are read in for the objective function. These parameters are used in calculating the objective function against which the improvements are measured.

Returning to FIG. 5, in step 12 there will also be annealing schedule control parameters $N_1$, $N_2$ and $N_3$ which are external factors such as numbers of steps at each stage that are to be taken before a decision is made to change the temperature.

Referring next to FIG. 6, which is the optimization operation which using simulated annealing becomes minimization labelled element 2 of FIG. 4. Changes of temperature in two opposite directions are employed in the search for an optimal configuration. In accordance with the simulated annealing analogy the first direction will be called warming 20 indicating a simulated increase in temperature and the second direction is called cooling 21 indicating a simulated decrease in temperature.

The warming direction is followed first in which, in the annealing analogy, the temperature is increased and then the cooling direction in which the temperature is decreased.

In the warming direction 20, the temperature increases until a sufficiently large fraction of improvement attempts are accepted. This fraction may be set as part of the parameter numbers $N_1$, $N_2$, etc. described in connection with element 12 of FIG. 5. For example, in the program in FIGS. 18 et seq and in FIG. 5 this fraction is taken to be 0.9.

Conversely, in the cooling direction 21, the temperature is lowered by stages until no further improvements are gained.

It will be apparent to one skilled in the art that as the size of the array and the complexity of the criteria increase, many acceptable configurations will appear within an overall optimization trend.

Referring next to FIG. 7, the optimal configuration provides the details of the final position of all the objects in the design and these details are written into and stored in an output location 30. The output file in 30 will contain the location and interrelationship of all the elements involved in the improved configuration of the design. The stored information in 30 can be used directly as input for a second or subsequent placement improvement iteration for direct use such as specifications, or it can be passed to a utilization tool such as a mask generator, an electron beam writer, or a routing device for wire.

Since, for applications of the invention in larger arrays, the invention is particularly adaptable to computer technology the illustrations of FIGS. 8 to 17 are separated along the lines of subroutines in a program for ease of illustration as functional flow charts.

Referring next to FIGS. 8 to 12, a functional flow chart of a scoring procedure is illustrated.

Under the annealing simulation the objective function to be minimized is viewed as the energy of the system. It sets the scale of temperatures. If each new configuration lowers the objective function it is accepted. If the new configuration raises the objective function by an amount $\Delta E$ then it is accepted with a probability equal to exp $(-\Delta E/T)$.

Figure 8:
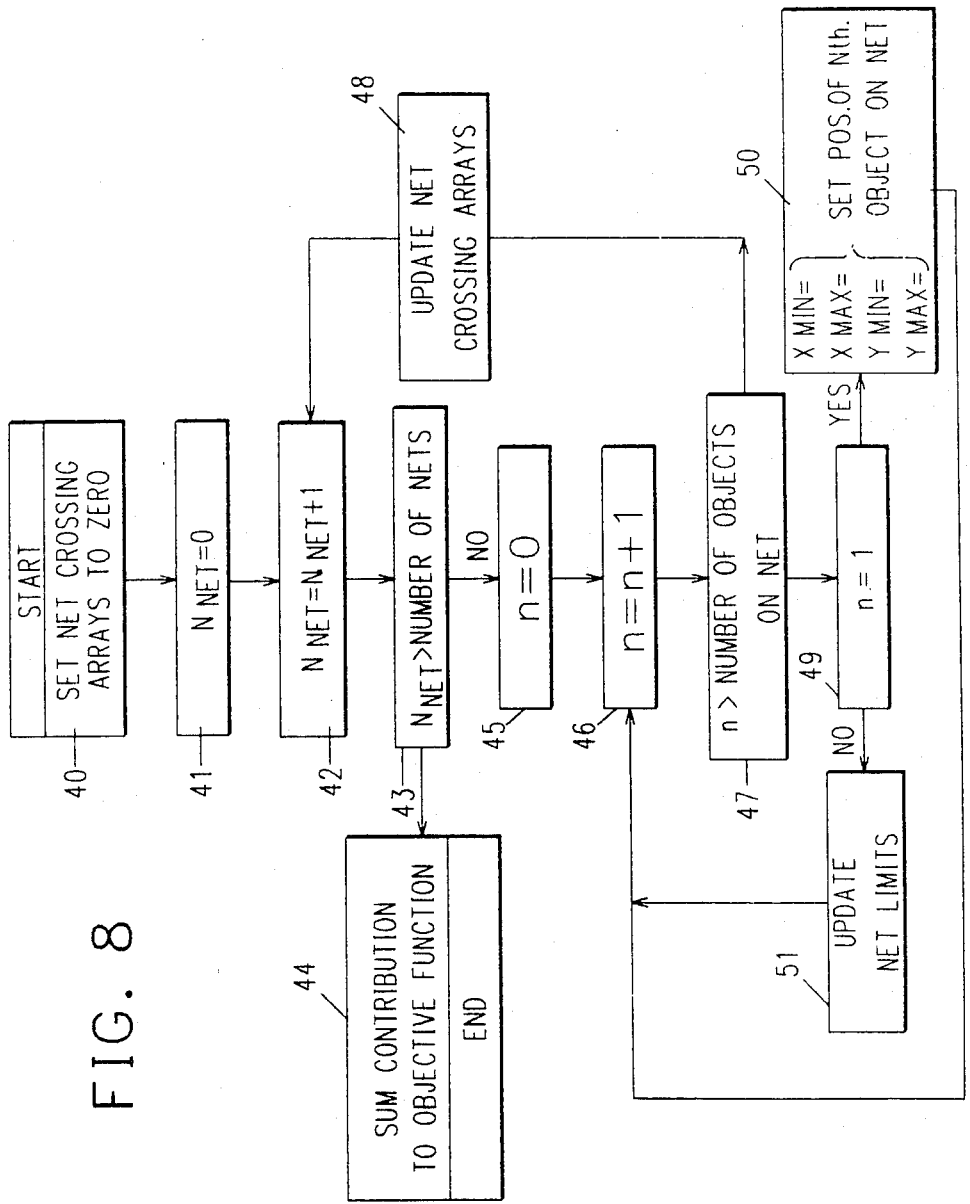

In FIG. 8, the procedure is serially as follows. In the first step 40 the entries in the arrays are set to zero. In step 41, an iteration counter labelled $N_{net}$ is provided and is set equal to zero. At the top of the basic loop at step 42, $N_{net}$ is incremented by 1. In step 43, $N_{net}$ is then tested against the total number of nets in the system and if it is still less than the total number of nets, the process continues. If it is greater, then all nets have been tested and the contribution to the objective function is summed in the output step 44. If $N_{net}$ is less than the number of nets, a second iteration counter labelled n is set equal to 0 in step 45 and then incremented in step 46. In step 47 the quantity n is tested to see if it is greater than the number of objects on the net under consideration. Where it is greater the net crossing arrays or histograms are updated in step 48 and there is a return to step 42 for a further iteration. If, however, n is less than the number of objects on a net in step 49, n is next tested for equality to 1. When n is equal to 1, the four quantities $x_{minimum}$ (XMIN), $x_{maximum}$ (XMAX), $y_{minimum}$ (YMIN), and $y_{maximum}$ (YMAX) are set to the x and y positions of the first object in the net in step 50. After setting $x_{minimum}$, $x_{maximum}$, $y_{minimum}$ and $y_{maximum}$, there is a return to step 46 for another iteration. In step 49 where n is not equal to 1, the net limits are then updated in step 51.

Figure 9:
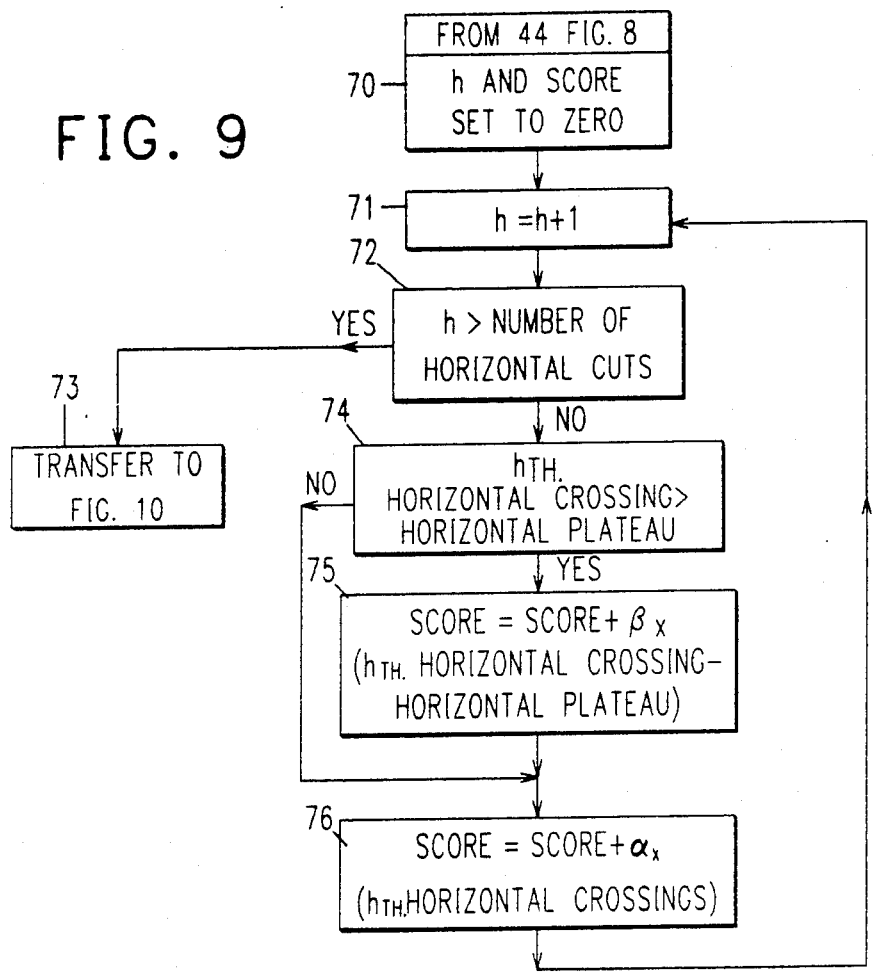

Referring to FIG. 9 a functional flow chart is illustrated that describes a procedure for taking the net limit information generated in FIG. 8 and using it to calculate the contribution to the score from the horizontal or column histogram.

In FIG. 9 from a functional standpoint the parameter $\beta_x$ is used to weight the amount by which the observed crossings exceed the threshold number of horizontal crossings or plateau. When the number of nets crossing a single boundary exceeds the horizontal plateau the score is incremented by the quantity $\beta_x$ times the square of the amount by which the number of horizontal crossings exceeds the plateau. The score is also incremented by $\alpha_x$ times the total number of horizontal crossings, obtained by summing the elements of the horizontal crossing histogram. In FIG. 9, the variable h which indicates which cut to consider in the histogram is set first to zero and then incremented at each iteration.

From a serial standpoint, in element 70 both h and the score are set equal to 0.

Provision is made in step 71 for incrementing h by 1. In 72 the value h is tested against the number of horizontal cuts to be taken. If h is greater than the number of horizontal cuts, the process transfers via element 73 for further processing in FIG. 10. If h is less than the total number of cuts to be included in the inter-location histogram, then the process continues. In element 74, the number of crossings in the $h^{th}$ entry of the horizontal net crossing histogram is compared with the horizontal plateau. If it exceeds the horizontal plateau, then the score is incremented in element 75 by the factor $\beta_x$ times the square of the amount by which the number of horizontal crossings in the $h_{th}$ element of the array exceeds the plateau. If, however, the number of crossings is less than the plateau value, the incrementing in element 75 is bypassed. At element 76 the score is incremented by $\alpha_x$ times the number of crossings found in the $h_{th}$ entry of the horizontal net crossing histogram. The procedure then returns to the top of the loop at element 71 for another iteration. The output at 73 is transferred to the procedure illustrated in FIG. 10, which is identical with FIG. 9 except in this instance vertical cuts are being scored and the parameters $\alpha_y$ and $\beta_y$ are used to weight the amount by which the observed crossings exceed the plateau and the number of vertical crossings.

Figure 10:
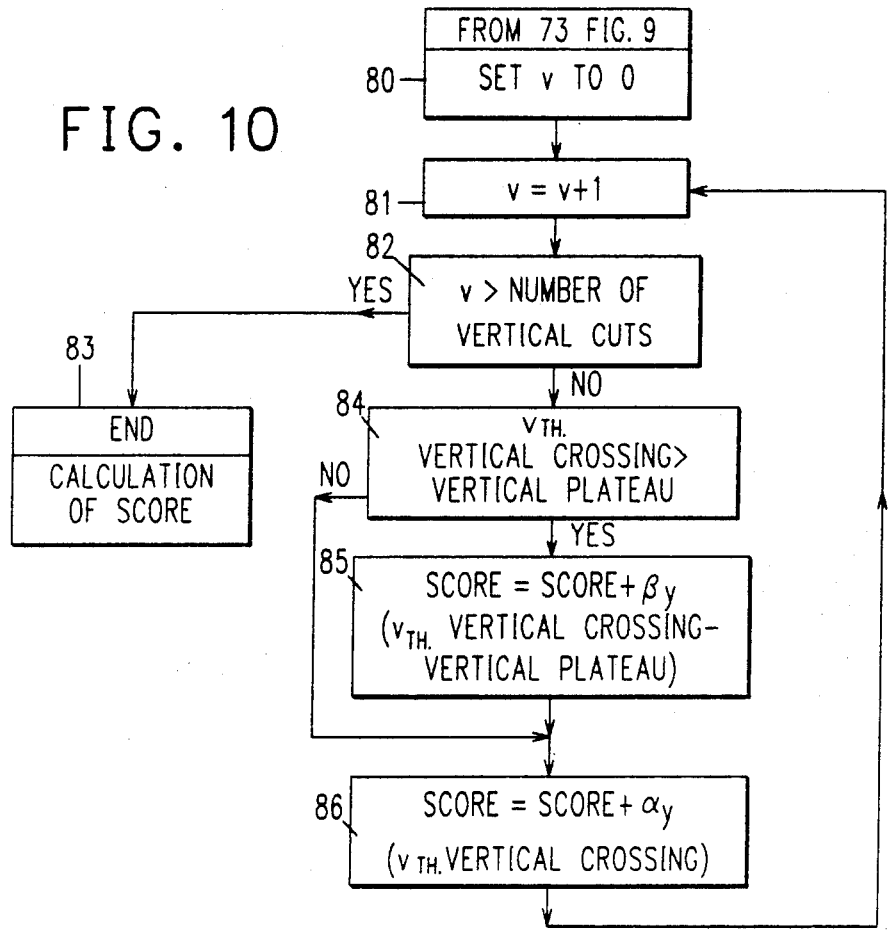

When the loops of FIGS. 8, 9 and 10 are completed, the process of calculating the total score will be complete.

Referring next to FIG. 10, from a functional standpoint, the parameters $\alpha_y$ and $\beta_y$ are used to weight the amount by which the observed crossings exceed the plateau and the number of vertical crossings. First, the variable v is set equal to 0. The variable v is then incremented by 1 on each iteration and tested until it exceeds the total number of cuts to be included. The process compares each crossing under study with the value of a vertical plateau. If the number of crossings exceeds the vertical plateau, the score is incremented by $\beta y$ times the square of the amount by which the number of vertical crossings in that entry exceeds the plateau. Finally, the score is incremented by $\alpha_y$ times the number of crossings at the entry under study.

From a serial standpoint, in FIG. 10 the information is received in element 73 and the variable v is set equal to 0. Provision is made in element 81 for incrementing v by 1. In element 82 the value v is tested against the number of cuts to be taken. If v is greater than the number of vertical cuts, the information enters element 83 which is the end of the scoring routine. If, on the other hand, in element 82, v is less than the total number of cuts to be included, then the process continues in element 84. In element 84, the number of crossings in the $v_{th}$ entry of the vertical net crossing histogram is tested. If it exceeds the vertical plateau then the score is incremented in element 85 by the factor $\beta_y$ times the square of the amount by which the number of vertical crossings in the $v_{th}$ element of the array exceeds the plateau. If, however, the number of crossings is less than the plateau value, the incrementing in element 85 will be bypassed. In element 86 the score is incremented by $\alpha_y$ times the number of crossings found in the $v_{th}$ entry of the vertical net crossing histogram. The program then branches to the top of the loop at element 81 for another iteration.

Figure 11:
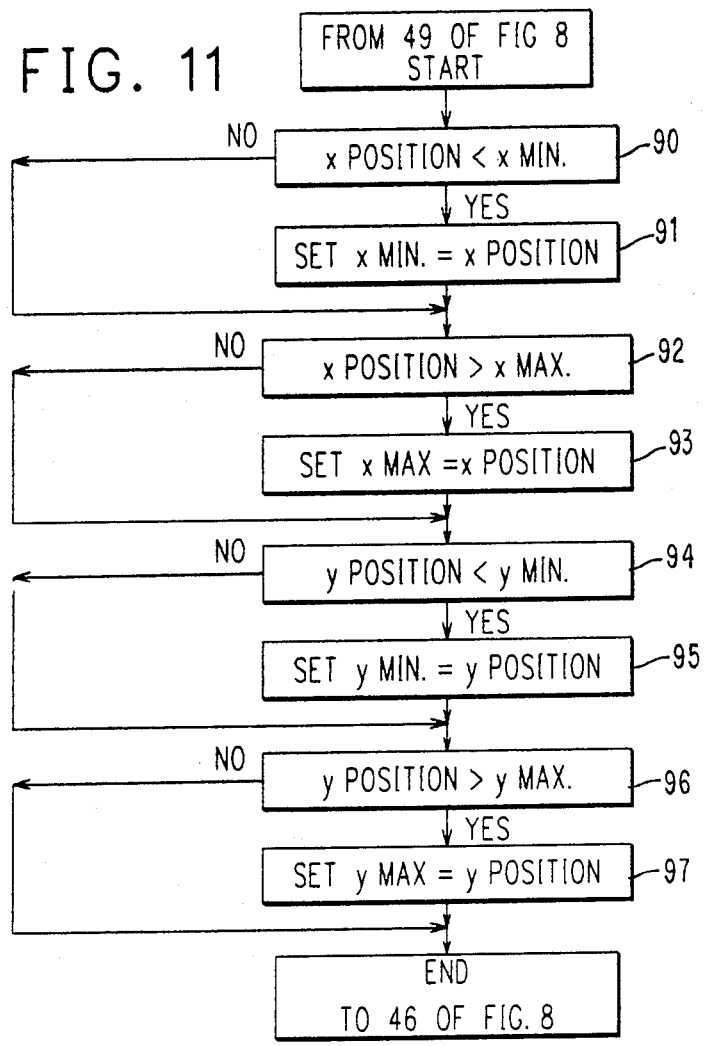

Referring next to FIG. 11, a functional flow chart is provided to illustrate the updating of the net limits required in element 51 of FIG. 8. The designations x and y are the horizontal and vertical coordinates of the $n_{th}$ object on the net. From a functional standpoint, the flow chart involves four tests. If the present position x is less than $x_{minimum}$, then $x_{minimum}$ is set equal to the position x. Second, if the position x exceeds $x_{maximum}$, then $x_{maximum}$ is set equal to position x. Third, if y is less than $y_{minimum}$, then $y_{minimum}$ is set equal to the present position y and fourth, if y is greater than $y_{maximum}$, then $y_{maximum}$ is set equal to the present position y.

The information from element 49 is employed to set the net limits and then to return the set information to element 46 of FIG. 8.

In FIG. 11 serially the x position is first tested in element 90 for its relationship with respect to $x_{minimum}$. If it is found to be less than $x_{minimum}$, $x_{minimum}$ is set in element 91 to the value of the x position. In the event that the x position is greater than $x_{minimum}$ element 91 is bypassed. The x position is then compared with $x_{maximum}$ in element 92 and if it is found to be greater, the value for $x_{maximum}$ is set in element 93 to the value of the x position. Where, in element 92, the x-position is found to be less, then element 93 is bypassed. In element 94, the y position is tested with respect to $y_{minimum}$ and where it is found to be less, in element 95 $y_{minimum}$ is set to the value of the y position. Where it is found to be greater, element 95 is bypassed. Similarly, in element 96 the y position is tested with respect to $y_{maximum}$. Where it is found to be greater, in element 97 $y_{maximum}$ is set to the value of the y position. Where the y position is found to be less than $y_{maximum}$, element 97 is bypassed and the information from all settings is conveyed to element 46 in FIG. 8.

Figure 12:
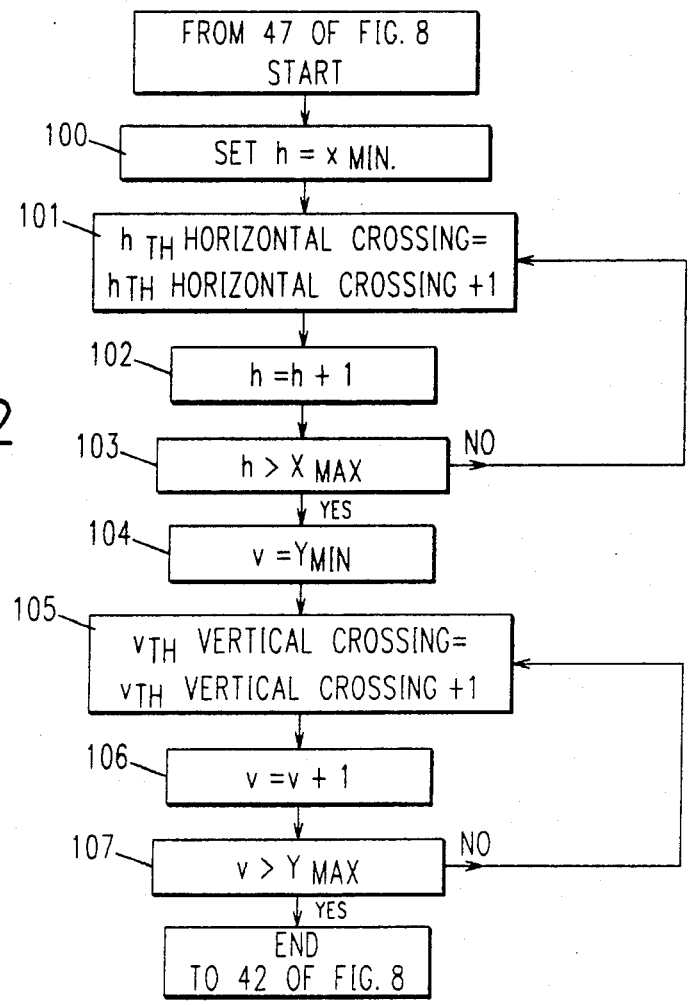

Referring next to FIG. 12, a functional flow chart is provided that describes the updating of the net crossing array required in element 48 of FIG. 8.

From a functional standpoint, once the values of $x_{minimum}$, $x_{maximum}$, $y_{minimum}$, and $y_{maximum}$ are known, first h is set equal to $x_{minimum}$, the $h^{th}$ entry of the horizontal net crossing histogram is incremented by 1, h is incremented by 1 and then compared with $x_{maximum}$. If h is less than or equal to $x_{maximum}$, another iteration takes place. When h becomes greater than $x_{maximum}$, the same procedure is applied to the vertical net crossing histogram, updating all entries between $y_{minimum}$ and $y_{maximum}$.

From a serial standpoint, in the flow chart of FIG. 12, the information from element 47 of FIG. 8, is entered in element 100 and h is set equal to $x_{minimum}$. In element 101, the $h^{th}$ entry of the horizontal net crossing histogram is incremented by 1 and in element 102, the value h is also incremented by 1. These conditions are tested in element 103 to determine if h is now greater than $x_{maximum}$. Where it is found not to be greater, the steps of elements 101 and 102 are repeated for another iteration. Where h is found to be greater, in element 104 the variable v is set equal to $y_{minimum}$, and in element 105, the $v^{th}$ vertical crossing is incremented by 1. In element 106, the value of v is increased by 1. In element 107 the value of v is tested as being greater than $y_{maximum}$, and where it is found to be less than $y_{maximum}$, the steps of elements 105 and 106 are repeated. Once v is found to be greater than $y_{maximum}$, the information is provided to element 42 of FIG. 8.

Figure 13:
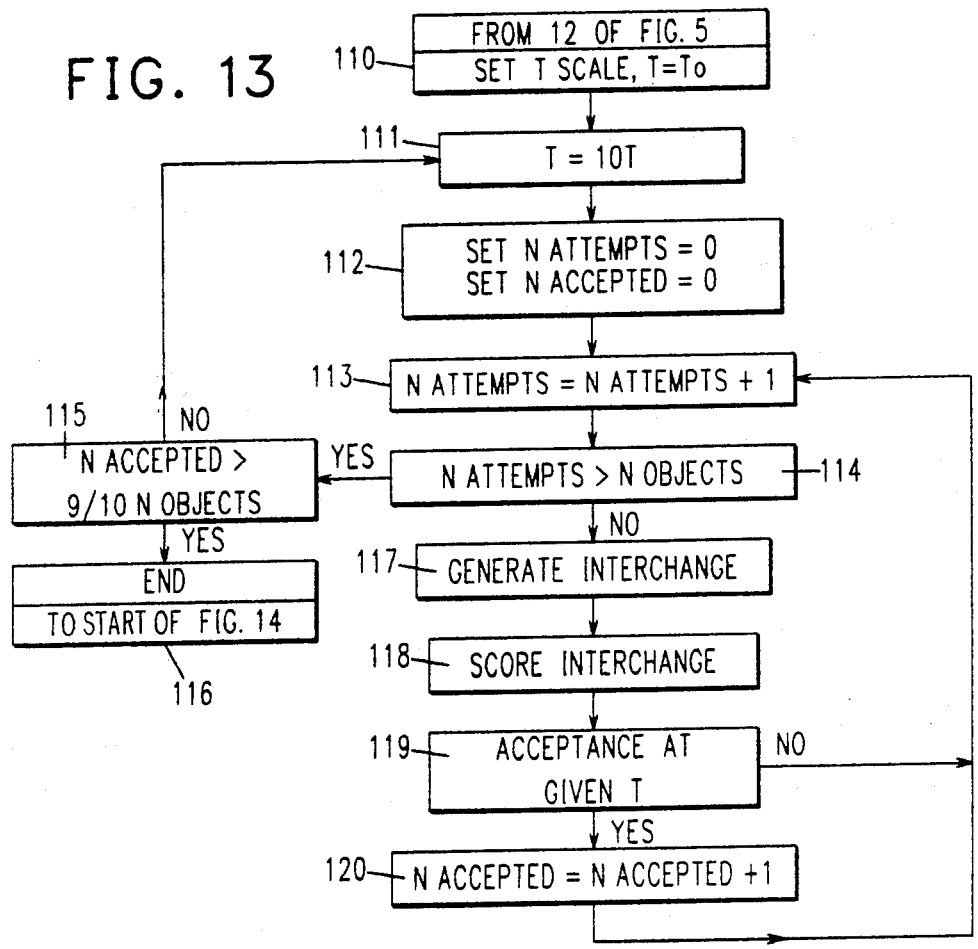

A functional flow chart for the annealing simulation for the upward or increasing temperature direction is illustrated in FIG. 13 and for the downward or decreasing temperature direction, in FIG. 14.

In FIG. 13, the warming phase of the annealing procedure, in the element 110 the initial temperature $T_0$ and the incremental temperature scale are established. It is possible to read from an external file or follow the procedure in the FIG. 16 flow chart to establish experimentally an appropriate scale. In addition, the current temperature is set equal to $T_0$. In element 111, T is multiplied by 10. In element 112, the number of attempts, labelled $N_{attempts}$, is set equal to 0, and the number of those attempts that are accepted, labelled $N_{accepted}$, is also set equal to 0. The $N_{attempts}$ variable is incremented by 1 in element 113 and a comparison is made in element 114 of the number of attempts ($N_{attempts}$) vs the number of objects ($N_{objects}$). If $N_{attempts}$ is greater than $N_{objects}$, the process transfers to element 115. If the number accepted is less than 9/10 of the number of objects, the process transfers to element 111 for another temperature iteration. If the number accepted is greater than 9/10 of the objects, the information becomes available in element 116.

If, however, in element 114, $N_{attempts}$ is less than N objects, the process continues, an interchange is proposed in element 117 and the result is scored in element 118 in accordance with the flow charts of FIGS. 8–12.

The score of the proposed new configuration is called "New Score". This permits the decision of whether or not to accept the result of the proposed interchange, under the circumstances set by the current value of the temperature in element 119 as determined in FIG. 17. If the interchange is accepted, $N_{accepted}$ is incremented by 1 in element 120 and the process returns to the top of the loop at element 113.

If the interchange, however, is not accepted, the process does not increment the acceptances and returns to element 113. An exit from this loop, however, is always taken at element 114 when the number of attempts exceeds the number of objects.

In FIG. 14 there is provided a functional flow chart describing the downward direction of the simulated annealing process. The simulated temperature is progressively decreased under the influence of a count of acceptance vs attempts.

In FIG. 14, serially $N_{stuck}$ is set equal to 0 in element start. At the top of an outer loop, in element 121 $N_{attempts}$ is set equal to 0 and $N_{accepted}$ is also set equal to 0. In element 122, $N_{attempts}$ is incremented by 1. An interchange is proposed in element 123 and the result is then scored in element 124 in accordance with FIGS. 8–12. A decision of whether or not to accept the interchange given the current value of the temperature takes place in element 125. If the interchange is accepted, $N_{accepted}$ is set equal to $N_{accepted}+1$ in element 126 and the incremented variable $N_{accepted}$ is then compared with the process parameter $N_1$ times the number of objects in element 127. If in element 125 there is no acceptance, elements 126 and 127 are bypassed. Returning to element 127 if $N_{accepted}$ is greater than $N_1$ times the number of objects, there is a return to element 121 through element 128 which reduces the temperature by $\frac{2}{3}$ for another iteration. If $N_{accepted}$ is less than $N_1$ times the number of objects in element 127 or if the interchange was not accepted, a comparison of the number of attempts with a parameter $N_2$ times the number of objects takes place in element 129. If $N_{attempts}$ is less than $N_2$ times the number of objects, the operation returns to the top of the inner loop at element 122 and continues. If $N_{attempts}$ is greater than or equal to $N_2$ times the number of objects, then $N_{stuck}$ is incremented by 1 in element 130 and a comparison of $N_{accepted}$ with 0 takes place in element 131. If $N_{accepted}$ is equal to 0, $N_{stuck}$ is set equal to $N_3$ in element 132. Given a result of no in element 131, the process proceeds to element 133. Given a result of yes in element 131, element 132 is employed to reset $N_{stuck}$ before proceeding to element 133.

In element 133, $N_{stuck}$ is compared with $N_3$. If $N_{stuck}$ is found to be less than $N_3$, the temperature is multiplied by a factor of $\frac{2}{3}$ in element 128 and another iteration takes place beginning at element 121.

Exit from the program at element 133 occurs after $N_{stuck}$ is found to be equal to or exceed $N_3$.

Figure 15:
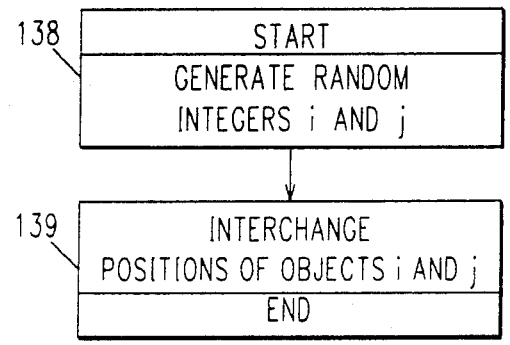

In FIG. 15 a functional flow chart is provided illustrating the considerations involved in a move in which two devices are interchanged. In FIG. 15, two random integers, i and j, in the range between one and the number of objects involved are selected and entered in element 138. Then in a second step 139, the position of object i is set equal to the previous position of object j and the position of object j is then set equal to the previous position of object i. The operation of proposing an interchange is employed at a number of stages in the process.

Figure 16:
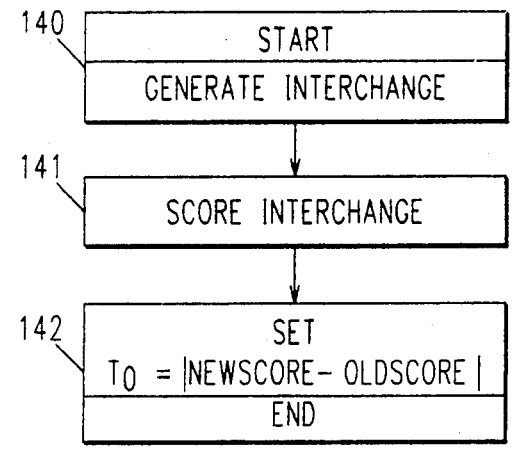

In FIG. 16, a functional flow chart is provided illustrating the establishment of an initial temperature, $T_0$ for element 110 of FIG. 13. In FIG. 16, the interchange description from element 139 in FIG. 15, is entered at element 140 and the effect of the interchange is then scored in element 141 in accordance with scoring operation previously described. In element 142, the initial temperature scale $T_0$ will be the absolute value of the difference between the score after the interchange and the score before the interchange.

The probability of acceptance of an interchange will change depending on the temperature.

Figure 17:
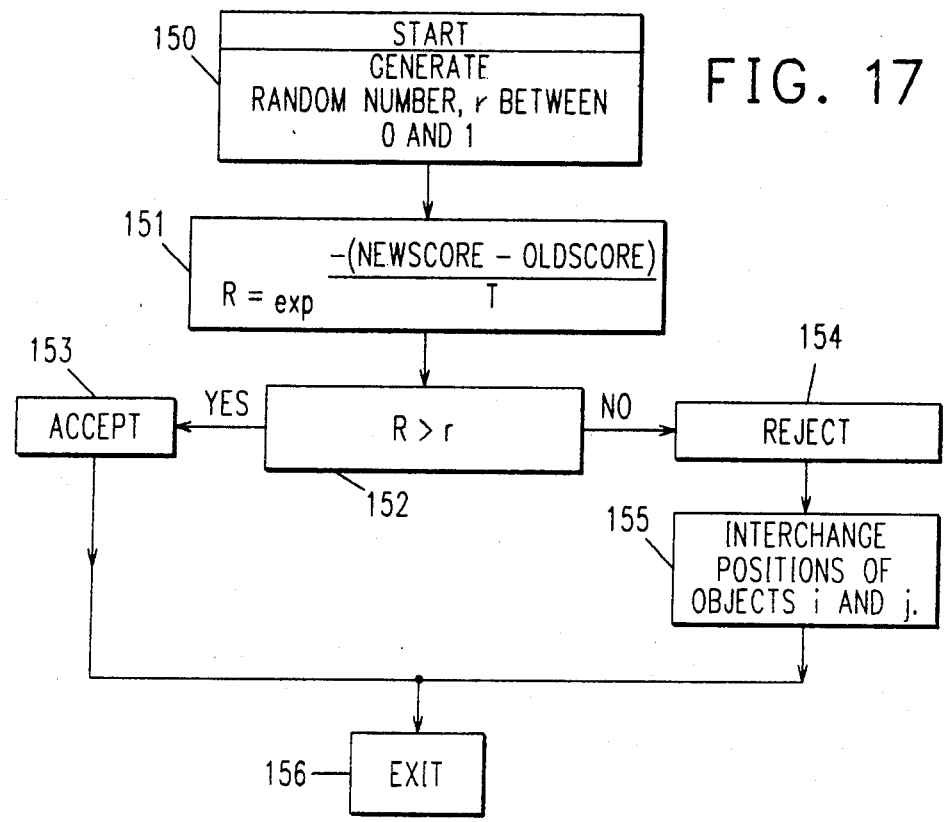

In FIG. 17 a functional flow chart illustrates how a decision is made whether or not to accept an interchange at the given value of simulated temperature T.

In FIG. 17, in element 150, a random number r is generated with a value between 0 and 1 and in step 151 there is a computation of the value of R equal to the exponential to the base e of the old score minus the new score divided by T, the temperature. The computed value of R is then compared with the value of r in element 152 and if R is greater than r, the interchange will be accepted in element 153. Where the value of R is less than that of r, the interchange is rejected in element 154 and in element 155 the positions are reestablished as they were prior to the proposed interchange. The result is available in element 156.

The illustrations of FIGS. 8 to 17 may be assembled into a single computer programming implementation as set forth in FIGS. 18 to 48. The program is written in the Fortran language and the assembly language both well known in the art and is within the capabilities of most computers. The particular implementation of FIGS. 18 to 48 is compatible with the IBM System 370.

The progress toward optimization employing the principles of the invention may be seen in more detail in the following discussion.

Employing a program such as provided in FIGS. 18 to 48 there is provided a further illustration of the example set forth in connection with FIGS. 53, 54, and 55 with a number of steps in both the upward labelled warm and the downward labelled cool directions. In the program, the following symbols were used:

LAMDAX = $1/\beta_x$
LAMDAY = $1/\beta_y$
X-PLAT = Horizontal Plateau
Y-PLAT = Vertical Plateau
$a_x = 1$
$a_y = 1$ The seed for the random number generator is labelled ISEED.

The temperature is first increased a factor of 10 in the upward direction and then in a series of downward iterations the temperature is systematically decreased. The digits outside the rows and columns represent the histogram entries described in connection with and FIGS. 53, 54, and 55.

```
MAIN: NROWS,NCOLS =  3   3
INITIAL POSITION:
        D    O    G
    6
        H    E    N
```

-continued

```
        3
    C     A     T
      3     3
ENTER ISEED:
?
12345
MAIN: ISEED = 12345
SCOREI: INPUT VALUES FOR X-PLATEAU, LAMDAX, Y-PLATEAU, LAMDAY:
?
4 1 4 1
    X-PLAT  LAMDAX  Y-PLAT  LAMDAY
      4       1       4       1
SCOREI: INPUT COOLING PARAMETERS N1, N2, N3 AND TRATIO:
?
5 50 5 .7
    N1  N2  N3   TRATIO
     5  50   5   0.70000
WARM: INITIAL TEMPERATURE =   8.00
WARM: T =  8.00 ,     5 SUCCESSES IN   10 ATTEMPTS. RATIO =   5.000
WARM: T = 80.0  ,     9 SUCCESSES IN   10 ATTEMPTS. RATIO =   9.000
COOL: FOR T =  80.0 ,    45 SUCCESSES IN   47 ATTEMPTS. CURRENT POSITION:
        O     T     A
    5
        C     D     E
    5
        N     H     G
          8     9
COOL: FOR T =  56.0 ,    45 SUCCESSES IN   45 ATTEMPTS. CURRENT POSITION:
        A     T     N
    5
        H     D     E
    7
        O     C     G
          7     4
COOL: FOR T =  39.2 ,    45 SUCCESSES IN   50 ATTEMPTS. CURRENT POSITION:
        H     E     O
    5
        C     A     G
    7
        D     N     T
          3     5
COOL: FOR T =  27.4 ,    45 SUCCESSES IN   52 ATTEMPTS. CURRENT POSITION:
        N     G     A
    6
        T     D     E
    8
        H     C     O
          6     6
COOL: FOR T =  19.2 ,    45 SUCCESSES IN   57 ATTEMPTS. CURRENT POSITION:
        A     T     O
    5
        G     N     D
    5
        H     C     E
          8     6
COOL: FOR T =  13.4 ,    45 SUCCESSES IN   68 ATTEMPTS. CURRENT POSITION:
        D     C     T
    5
        O     H     G
    6
        A     N     E
          6     6
COOL: FOR T =   9.41,    45 SUCCESSES IN   72 ATTEMPTS. CURRENT POSITION:
        A     N     C
    5
        H     T     G
    6
        D     O     E
          6     8
COOL: FOR T =   6.59,    45 SUCCESSES IN   90 ATTEMPTS. CURRENT POSITION:
        D     O     H
    5
        T     A     E
    5
        C     G     N
          5     3
COOL: FOR T =   4.61,    45 SUCCESSES IN  132 ATTEMPTS. CURRENT POSITION:
        H     C     E
    5
        G     D     O
    5
        N     T     A
```

-continued

```
COOL: FOR T =  5   6              45 SUCCESSES IN  115 ATTEMPTS. CURRENT POSITION:
               3.23      ,
       O    E    H
    5
       G    D    N
    3
       A    T    C
COOL: FOR T =  6   6              45 SUCCESSES IN  224 ATTEMPTS. CURRENT POSITION:
               2.26      ,
       D    O    H
    5
       C    E    T
    6
       A    G    N
COOL: FOR T =  4   6              45 SUCCESSES IN  316 ATTEMPTS. CURRENT POSITION:
               1.58      ,
       H    A    T
    5
       D    C    G
    5
       E    O    N
COOL: FOR T =  4   3              3 SUCCESSES IN   450 ATTEMPTS. CURRENT POSITION:
               1.11      ,
       C    A    T
    3
       D    O    G
    3
       H    E    N
COOL: FOR T =  3   3              0 SUCCESSES IN   450 ATTEMPTS. CURRENT POSITION:
               .775      ,
       C    A    T
    3
       D    O    G
    3
       H    E    N
               3   3
FINAL POSITION:
       C    A    T
    3
       D    O    G
    3
       H    E    N
               3   3
```

It will be apparent to one skilled in the art that the advantages of the invention become even more valuable as the scale of the array involved becomes larger. As an illustration, the following specifications illustrate the advantage of the use of the invention on a semiconductor circuit package containing 98 circuit chips. The package contains 2970 nets, 4984 two-point connections, 6877 input-output connections from chips and the entire package has 1077 input and output connections.

The graphs of FIG. 49 drawn to a common abscissa scale illustrate the fact that in such a configuration in 450 thousand interchanges the procedure of the invention reduced the wire length by half and the number of crossings from 1600 to less than 700.

Figure 50:
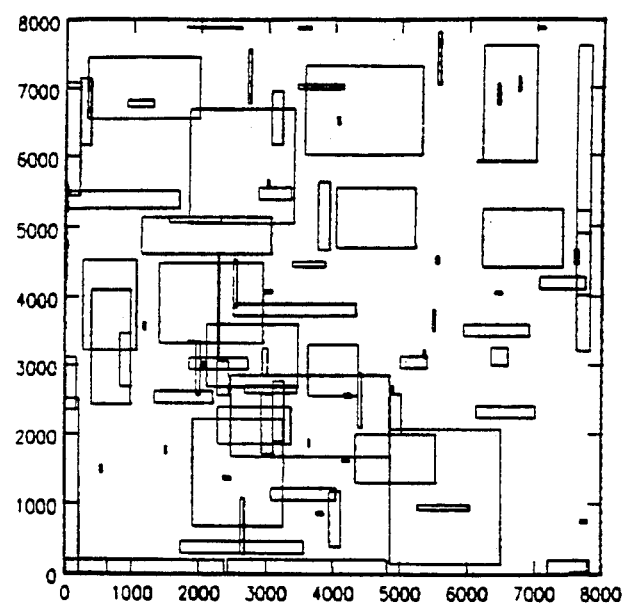
Figure 51:
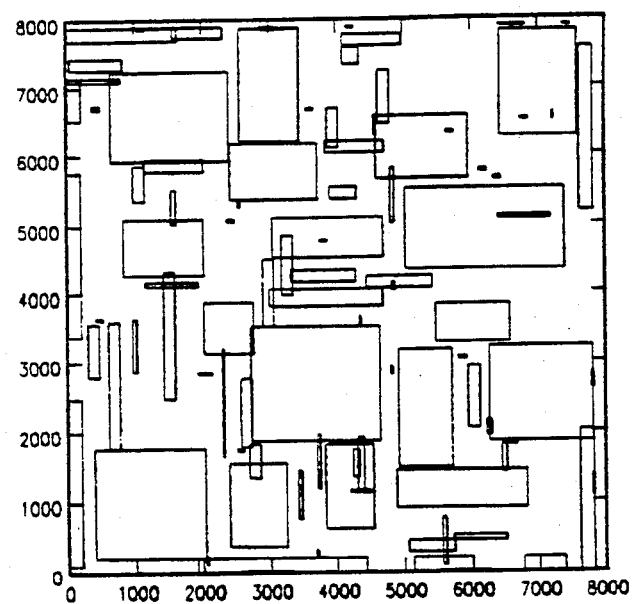

The advantages of the invention may be further observed in connection with the handling of complex constraints. One such constraint in area type layouts, such as integrated circuits, is the overlap prohibition of subassembly circuits or macro circuits. Referring to FIGS. 50, 51 and 52 there is shown a progressive improvement in reduction of overlap as the simulated temperature is reduced and the array is scored on wire length, wire congestion including blockage and macro overlap.

What has been described is an optimization technique employing interdependently two operations, the first of which scores the effect of individual discrete element changes with respect to an objective function related to the usefulness of the design. Superimposed upon this, a second operation is an overall incremental variation applied to all objects in the design which affects acceptance of proposed element changes. The overall incremental variation has been described with the relationship of the concept of annealing and the combined variation of individual objects coupled with variations applied to all objects permit a more efficient optimization and at the same time the ability to examine the magnitude of minor variations without losing track of overall progress.

Having thus described our invention, what we claim as new and desire to secure by Letters Patent is:

1. A method of positioning all the individual elements of an interconnected configuration assembled into a unitary computational entity that satisfies at least one usefulness specification where said individual elements are of the type including semiconductor devices on a semiconductor chip, semiconductor chips on a modular package, modular packages on wiring supporting boards, and circuits in an array and where said usefulness specification includes wiring density and wiring net length comprising in combination the steps of providing a representation of the interconnected configuration of elements, providing a scoring capability capable of providing a measure of acceptability of a particular configuration of said elements with respect to at least one of wiring density and wiring net length and interdependently iteratively exchanging the position of subsets of said elements and for each subset accepting or rejecting the resulting arrangement in accordance with a measure provided by said scoring capability and varying the measure of acceptance of a subset position exchange in accordance with an incremental trend.

2. The method of claim 1 wherein said variation of the measure of acceptance is by modifying a ratio of a first number that is the fraction of subset position exchanges which said scoring capability indicates not to be an improvement which are accepted and a second number that is the fraction of subset position exchanges that said scoring capability indicates are an improvement and are accepted.

3. The method of claim 2 wherein said incremental variation trend is simulated annealing.

4. A method of positioning all the physical elements of an interrelated configuration of said physical elements in a unitary functional entity wherein the interrelated positioning satisfies at least one specification related to the usefulness of said functional entity: comprising in combination the steps of providing a representation of all the interrelated individual physical elements in said collection, providing a scoring capability capable of measuring the acceptability of a particular positioned configuration of said elements with respect to said usefulness specification and interdependently iteratively exchanging the physical position occupied in said configuration of successive subsets of said elements and for each repositioned subset of said physical elements accepting or rejecting the resulting arrangement in accordance with a measure provided by said scoring capability, and varying the measure for acceptance of a subset position exchange in accordance with an incremental trend.

5. The method of claim 4 wherein said varying of the measure of acceptance is by modifying a ratio of a first number that is the fraction of position exchanges that said scoring capability indicates not to be an improvement toward satisfying said usefulness specification and are accepted and a second number that is the fraction of position exchanges that said scoring capability indicates to be an improvement toward satisfying said usefulness specification and are accepted.

6. The method of claim 5 wherein said incremental trend is simulated annealing.

* * * * *